United States Patent
Gong et al.

(10) Patent No.: US 10,340,458 B2
(45) Date of Patent: Jul. 2, 2019

(54) PEROVSKITE HYBRID SOLAR CELLS

(71) Applicants: Xiong Gong, Hudson, OH (US); Chang Liu, Akron, OH (US); Kai Wang, Akron, OH (US)

(72) Inventors: Xiong Gong, Hudson, OH (US); Chang Liu, Akron, OH (US); Kai Wang, Akron, OH (US)

(73) Assignee: The University of Akron, Akron, OH (US)

( * ) Notice: Subject to any disclaimer, the term of this patent is extended or adjusted under 35 U.S.C. 154(b) by 52 days.

(21) Appl. No.: 15/339,501

(22) Filed: Oct. 31, 2016

(65) Prior Publication Data

US 2017/0125172 A1     May 4, 2017

Related U.S. Application Data

(60) Provisional application No. 62/248,523, filed on Oct. 30, 2015.

(51) Int. Cl.
| | |
|---|---|
| *H01G 9/16* | (2006.01) |
| *H01G 9/20* | (2006.01) |
| *H01L 51/44* | (2006.01) |
| *G01J 1/42* | (2006.01) |
| *H01L 51/00* | (2006.01) |
| *H01L 51/42* | (2006.01) |

(52) U.S. Cl.
CPC ...... *H01L 51/0047* (2013.01); *H01L 51/0007* (2013.01); *H01L 51/0028* (2013.01); *H01L 51/4273* (2013.01); *H01L 51/0037* (2013.01); *H01L 51/0077* (2013.01); *Y02E 10/549* (2013.01)

(58) Field of Classification Search
CPC ............. H01L 51/4213; H01L 51/424; H01L 51/0003; H01L 51/0037; H01L 2251/308; H01L 51/0047; H01L 51/0094; Y02E 10/549
See application file for complete search history.

(56) References Cited

U.S. PATENT DOCUMENTS

| | | | |
|---|---|---|---|
| 9,391,287 B1 * | 7/2016 | Huang | H01L 51/4213 |
| 2016/0005986 A1 * | 1/2016 | Guo | H01L 31/032 |
| | | | 136/263 |

(Continued)

*Primary Examiner* — Brian Turner
(74) *Attorney, Agent, or Firm* — Renner Kenner Greive Bobak Taylor and Weber; Timothy A. Hodgkiss; Ray L. Weber

(57) ABSTRACT

Perovskite hybrid solar cells utilize a bulk heterojunction (BHJ) active layer that is formed as a composite of an organometal halide perovskite and a water soluble fullerene, such as $A_{10}C_{60}$. In alternative embodiments, the BHJ active layer may be formed as a composite of an organometal halide perovskite material and a fullerene, such as $PC_{61}BM$. Thus, the fullerene acts as an electron extraction acceptor within the BHJ, allowing such solar cells to more efficiently transport the electrons from the fullerene/perovskite interface to a fullerene-based electron transport layer (ETL). As a result, increased fill factor (FF), as well as improvements in the short-circuit current density ($J_{SC}$) and power conversion efficiency (PCE) are achieved by the solar cells.

17 Claims, 26 Drawing Sheets

(56) References Cited

U.S. PATENT DOCUMENTS

| | | | | |
|---|---|---|---|---|
| 2016/0218307 A1* | 7/2016 | Huang | ................ | H01L 51/4213 |
| 2016/0268510 A1* | 9/2016 | Moon | ................... | H01L 51/424 |
| 2016/0351808 A1* | 12/2016 | Luchinger | ................ | C09D 7/67 |
| 2016/0372674 A1* | 12/2016 | Nakano | .................... | C08K 3/04 |
| 2017/0025622 A1* | 1/2017 | Gong | ................. | H01L 51/0037 |

* cited by examiner

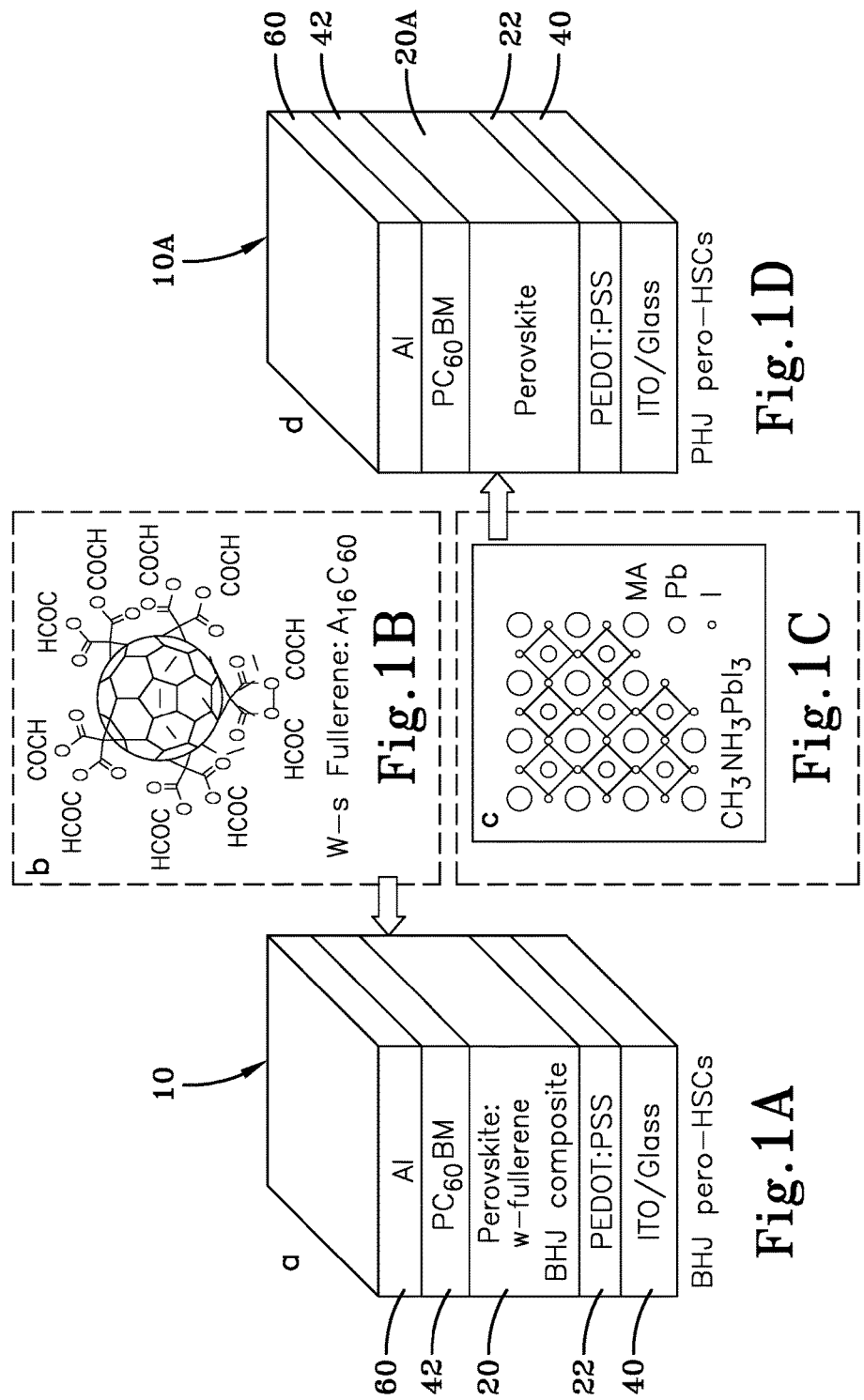

Depletion Region

Depletion Region

Table 1

| Devices | | Precursor Solution | $A_{10}C_{60}$ Concentration (mg/mL) | $V_{OC}$ (V) | $J_{SC}$ (mA/cm$^2$) | FF (%) | PCE (%) |
|---|---|---|---|---|---|---|---|
| PHJ pero-HSCs | Device-A | isopropanol | 0 | 0.88 | 14.38 | 64.8 | 8.21 |
| | Device-B | ethanol | 0 | 0.86 | 17.31 | 77.2 | 11.45 |
| BHJ pero-HSCs | Device-C | ethanol | 2.5 | 0.87 | 17.15 | 79.7 | 11.75 |
| | | | 5 | 0.89 | 17.52 | 82.6 | 12.88 |
| | | | 10 | 0.86 | 18.08 | 86.7 | 13.48 |
| | | | 15 | 0.88 | 19.41 | 81.6 | 13.97 |
| | | | 20 | 0.88 | 20.17 | 72.3 | 12.83 |

Fig.16

PEROVSKITE HYBRID SOLAR CELLS

CROSS-REFERENCE TO RELATED APPLICATION

This application claims the benefit of U.S. Provisional Application No. 62/248,523 filed Oct. 30, 2015, the contents of which are incorporated herein by reference.

STATEMENT REGARDING FEDERALLY SPONSORED RESEARCH OR DEVELOPMENT

This invention was made with government support under contract no. 1351785 awarded by the National Science Foundation (Electrical, Communications and Cyber Systems Division). The government has certain rights in the invention.

TECHNICAL FIELD

Generally, the embodiments of the present invention relate to solar cells. Particularly, the embodiments of the present invention relate to perovskite hybrid solar cells. More particularly, the embodiments of the present invention relate to perovskite hybrid solar cells that utilize a composite active layer of perovskite material and fullerene to improve the efficiency in which electrons are extracted therefrom.

BACKGROUND

Cost-effective, high-performance photovoltaic devices have been under intense investigation. Recently, a novel photovoltaic material, methylammonium lead halide ($MAPbX_3$) perovskite, has attracted much attention due to its unique potential in attaining increased power conversion efficiencies, while being suitable for use in low-cost solution-based manufacturing. Although ideal optical and semiconducting properties of $MAPbX_3$ perovskite have been demonstrated, one fundamental limitation of such materials is that of unbalanced electron-hole diffusion length. In particular, an electron beam-induced current (EBIC) study showed that the effective diffusion length of electrons is shorter than that of holes ($L_{eff,e-}/L_{eff,h+}<1$) in methylammonium lead iodide ($CH_3NH_3PbI_3$)-based perovskite hybrid solar cells (pero-HSCs), and as a result, such solar cells have an electron extraction process that is less efficient than that of the hole extraction process. Having an identical electron and hole diffusion length is critical to achieve equivalent carrier extraction efficiency in a symmetric device structure, which determines the final device efficiency. Therefore, to balance the efficiencies of the two types of charge carrier extraction processes (i.e. electron and hole extraction), and to restrain or limit the charge carrier recombination process, a separate conduit is needed to assist electrons that are being extracted from the perovskite material to the front electrode of the solar cell.

To achieve these performance requirements, two state-of-the-art device architectures have been developed. One device architecture is a meso-superstructured solar cell (MSSC), whereby a meso-structured $TiO_2$ or $Al_2O_3$ are utilized as an electron transport layer (ETL) and insulating scaffold, respectively. This ensures that effective charge separation occurs via an enlarging interfacial area, and as a result, a dramatically enhanced power conversion efficiency (PCE) of over 15%, from solution processed perovskite solar cells has been able to be achieved in some circumstances. However, the relatively low electrical conductivity of $TiO_2$ brings an additional charge transport resistance ($R_{CT}$) within the $TiO_2$ itself. In addition, the commonly used mesoporous metal oxides require the utilization high temperature sintering manufacturing techniques, which undesirably makes such perovskite-based solar cells incompatible with large-scale processing.

The second device architecture used to achieve balanced charge carrier extraction is planar heterojunction (PHJ) architecture. In PHJ architecture, a solution-processed, highly conductive n-type material, such as fullerene, is introduced into the electron transport layer (ETL). The higher electrical conductivity ensures a higher efficiency in the electron extraction process and less energy losses in the transfer process. However, the electron extraction efficiency of such devices is still not high enough due to the insufficient interface of the perovskite and fullerene in the PHJ, thereby inhibiting further increases in device performance. Moreover, in most PHJ structures, the commonly coarse surface of solution-processed perovskite films, generally results in an inferior contact with the fullerene, further deteriorating electron extraction. In addition, the rough surface morphologies of the perovskite film also introduce shunts into the solar cell, which leads to a large leakage current in the device, as well as a low fill factor (FF).

Therefore, there is a need for a perovskite-hybrid solar cell (pero-HSC) that has improved electron extraction performance. In addition, there is a need for a perovskite-hybrid solar cell (pero-HSC) that has a planar heterojunction (PHJ) that has improved contact between the perovskite and fullerene. There is also a need for a solar cell in which polar ethanol is used as a solvent for methylammonium iodide (MAI) precursor solution to give a homogeneous and pinhole-free $CH_3NH_3PbI_3$ perovskite film, which has reduced roughness, and thereby improved contact between the perovskite layer and the fullerene layer. For example, in some embodiments, the resulting pero-HSCs demonstrated both enhanced short circuit current ($J_{SC}$) and FF of 17.31 mA/cm$^2$ and 77.2%, respectively, resulting in a corresponding power conversion efficiency (PCE) of 11.45% for example. There is yet another need for further improvements in electron extraction efficiency through simultaneously increasing the electrical conductivity of electron transport layer (ETL) and enlarging the interfacial area between the ETL and the perovskite layer, by using a bulk hererojunction (BHJ) composite of perovskite:fullerene, whereby a water-soluble fullerene (ws-fullerene) is mixed with an MAI precursor in ethanol. Consequently, in some embodiments of the present invention, the enlarged interface between the perovskite and the n-type material gives rise to an increased $J_{SC}$ of 19.41 mA/cm$^2$ and an increased FF of 81.6% in the resulting BHJ pero-HSCs, corresponding to an enhanced PCE of 13.97%.

SUMMARY

In light of the foregoing, it is a first aspect of the embodiments of the present invention to provide a method of forming a bulk heterojunction active layer of a solar cell comprising the steps of providing an n-type perovskite hybrid semiconductor material; combining the perovskite hybrid semiconductor material with a water-soluble or a non-water-soluble fullerene to form a composite material; and applying the composite material in the solar cell as the bulk heterojunction active layer.

It is another aspect of the embodiments of the present invention to provide a solar cell comprising a bulk heterojunction active layer formed of a composite material of an n-type perovskite hybrid semiconductor material and a water-soluble or non-water-soluble fullerene material; an electron transport layer positioned adjacent to the bulk heterojunction active layer, wherein the electron transport layer comprises fullerene; a hole transport layer positioned adjacent to the bulk heterojunction active layer; a first electrode positioned adjacent to the hole transport layer; and a second electrode positioned adjacent to the electron transport layer, wherein at least one of the first or second electrodes is an at least partially light transparent electrode.

Still another aspect of the embodiments of the present invention is to provide a method of forming a planar heterojunction active layer of a solar cell comprising the steps of solution processing an n-type perovskite hybrid semiconductor precursor material using ethanol to form an n-type perovskite hybrid semiconductor material; and providing a layer of the n-type perovskite hybrid semiconductor material in the solar cell as the planar heterojunction active layer.

Yet another aspect of the embodiments of the present invention is to provide a solar cell comprising a planar heterojunction active layer formed of an ethanol solution processed n-type perovskite hybrid semiconductor material; an electron transport layer positioned adjacent to the bulk heterojunction active layer; a hole transport layer positioned adjacent to the bulk heterojunction active layer; a first electrode positioned adjacent to the hole transport layer; and a second electrode positioned adjacent to the electron transport layer, wherein at least one of the first or second electrodes is an at least partially light transparent electrode.

BRIEF DESCRIPTION OF THE DRAWINGS

These and other features and advantages of the present invention will become better understood with regard to the following description, appended claims, and accompanying drawings wherein:

FIG. 1A is cross-sectional schematic view of one embodiment of a bulk heterojunction (BHJ) perovskite-hybrid solar cell (pero-HSC) in accordance with the concepts of the various embodiments of the present invention;

FIG. 1B is a molecular structure of a water soluble (w-s) fullerene $A_{10}C_{60}$ (2-oxoacetic acid [60] fullerene);

FIG. 1C is a crystal structure of methylammonium lead iodide ($CH_3NH_3PbI_3$)-based perovskite hybrid material;

FIG. 1D is a cross-sectional schematic view of another embodiment of a planar heterojunction (PHJ) perovskite-hybrid solar cell (pero-HSC) in accordance with the concepts of the various embodiments of the present invention;

FIG. 5A is a top view scanning electron microscope (SEM) image of a $CH_3NH_3PBI_3$ (Film/Device-A) prepared from isopropanol, whereby the inset image (a'-i') is of higher resolution with a scale bar of 100 nm for each film respectively;

FIG. 5B is a top view SEM image of $CH_3NH_3PBI_3$ perovskite (Film/Device-B) prepared from ethanol, whereby the inset image (a'-i') is of higher resolution with a scale bar of 100 nm for each film respectively in accordance with the concepts of the various embodiments of the present invention;

FIG. 5C is a top view SEM image of a $CH_3NH_3PBI_3$:$A_{10}C_{60}$ BHJ composite (Film/Device-C) prepared from a mixed precursor solution, whereby the inset image (a'-i') is of higher resolution with a scale bar of 100 nm for each film respectively in accordance with the concepts of the various embodiments of the present invention;

Figure 7:
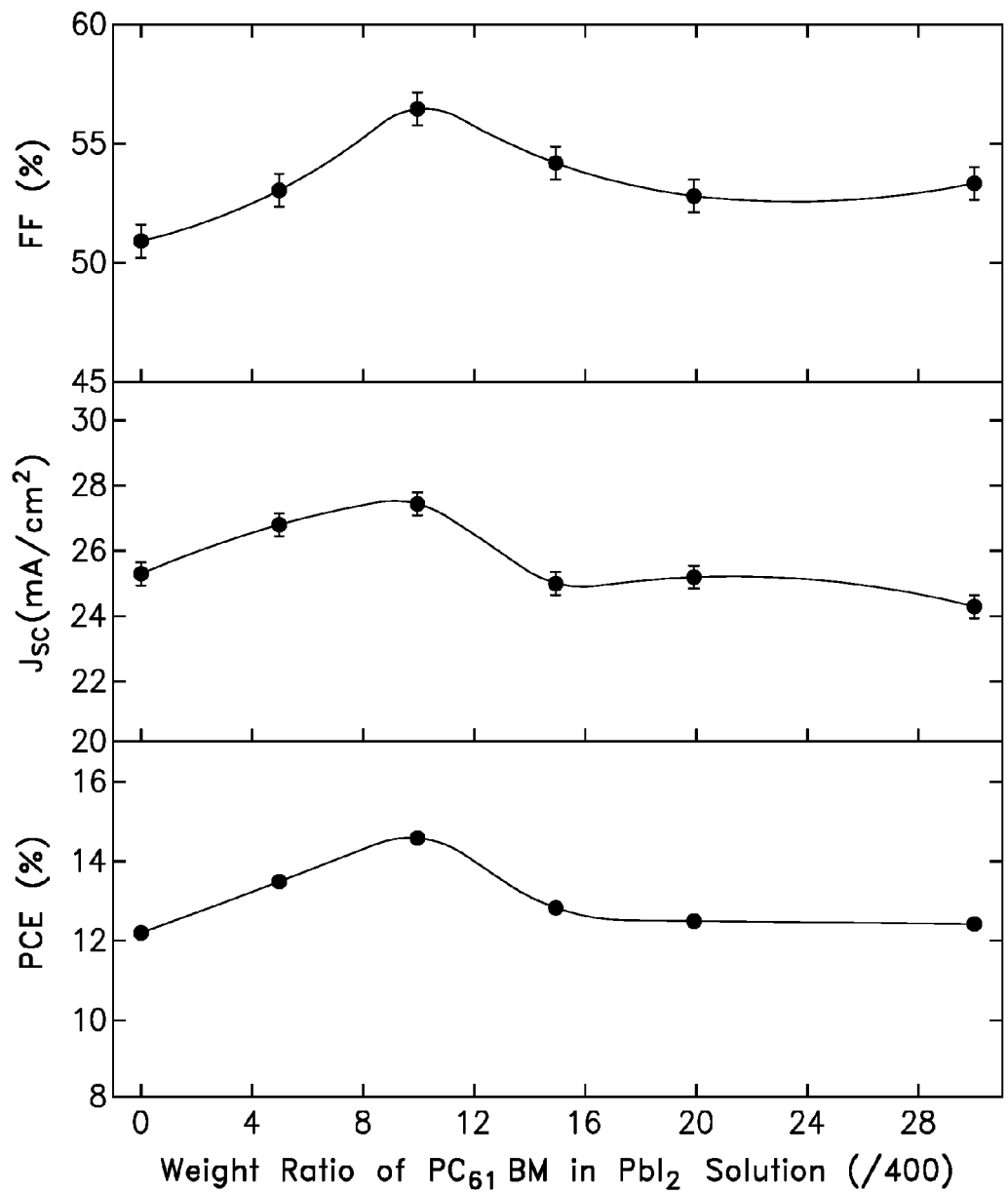
Figure 8A:
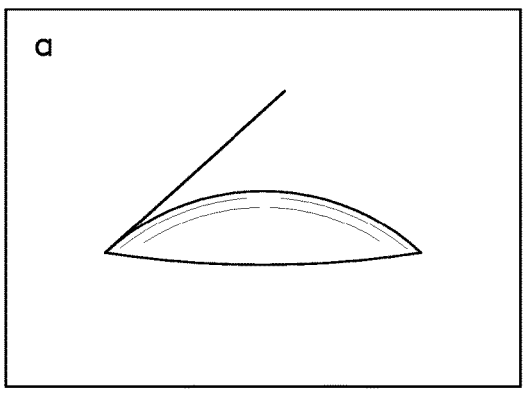
Figure 8B:
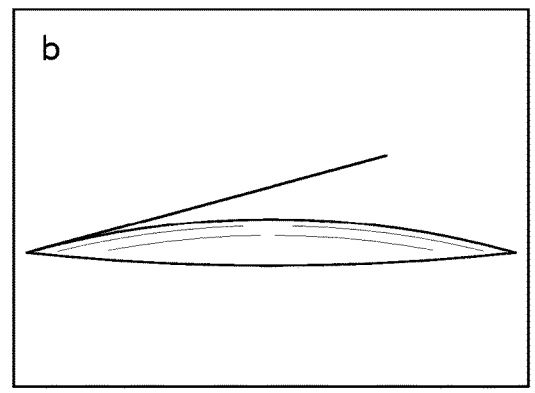
Figure 9A:
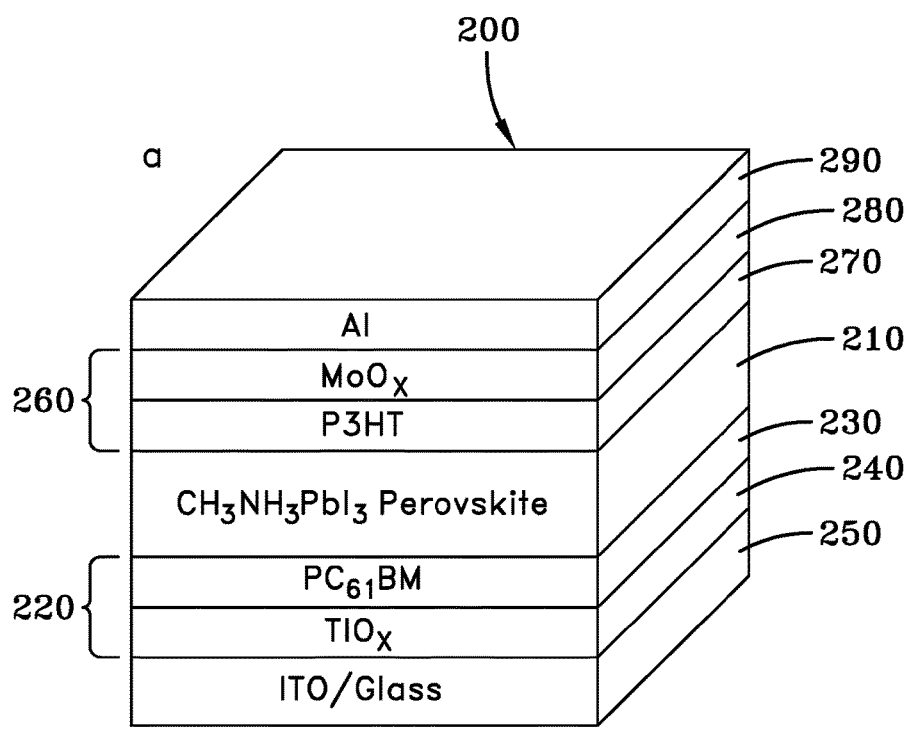
Figure 9B:
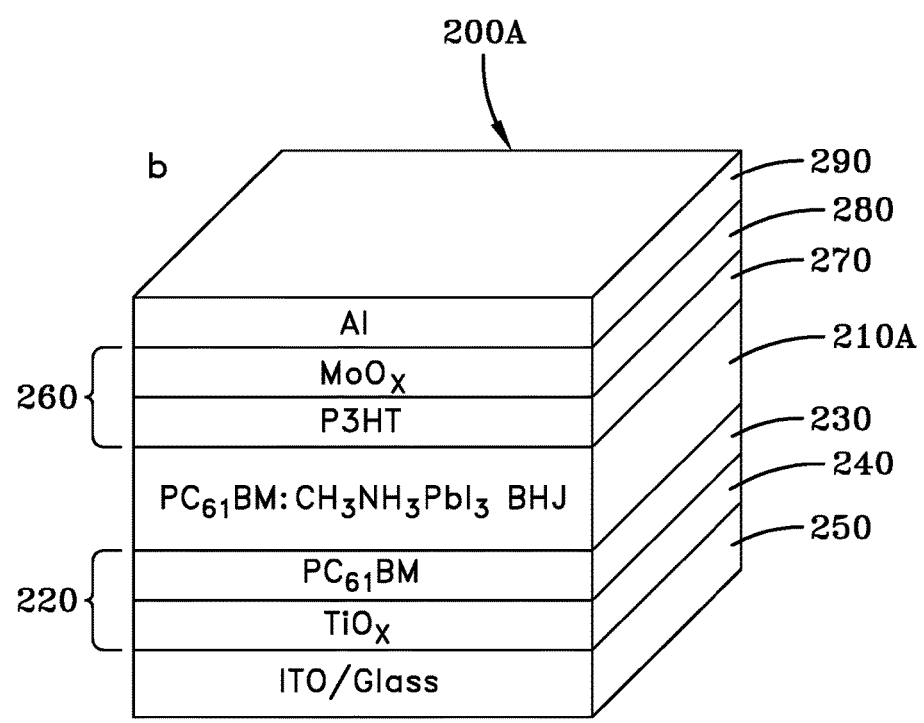
Figure 9C:
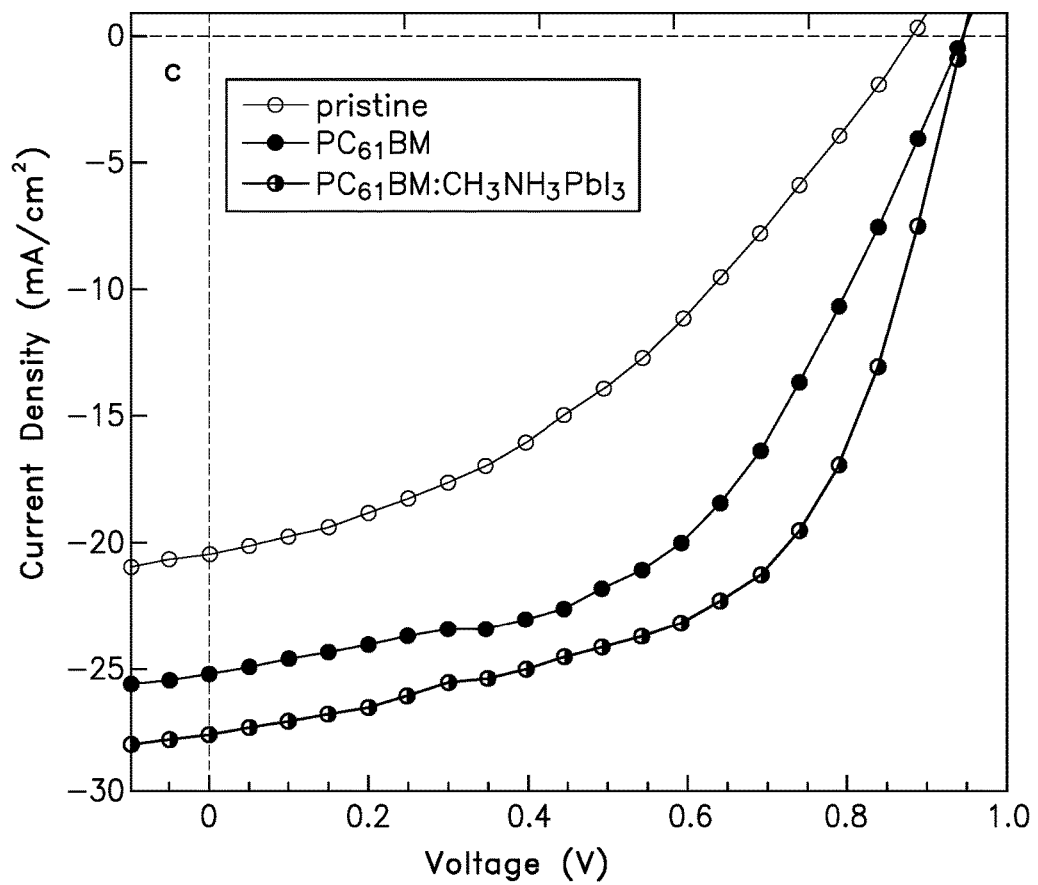
Figure 9D:
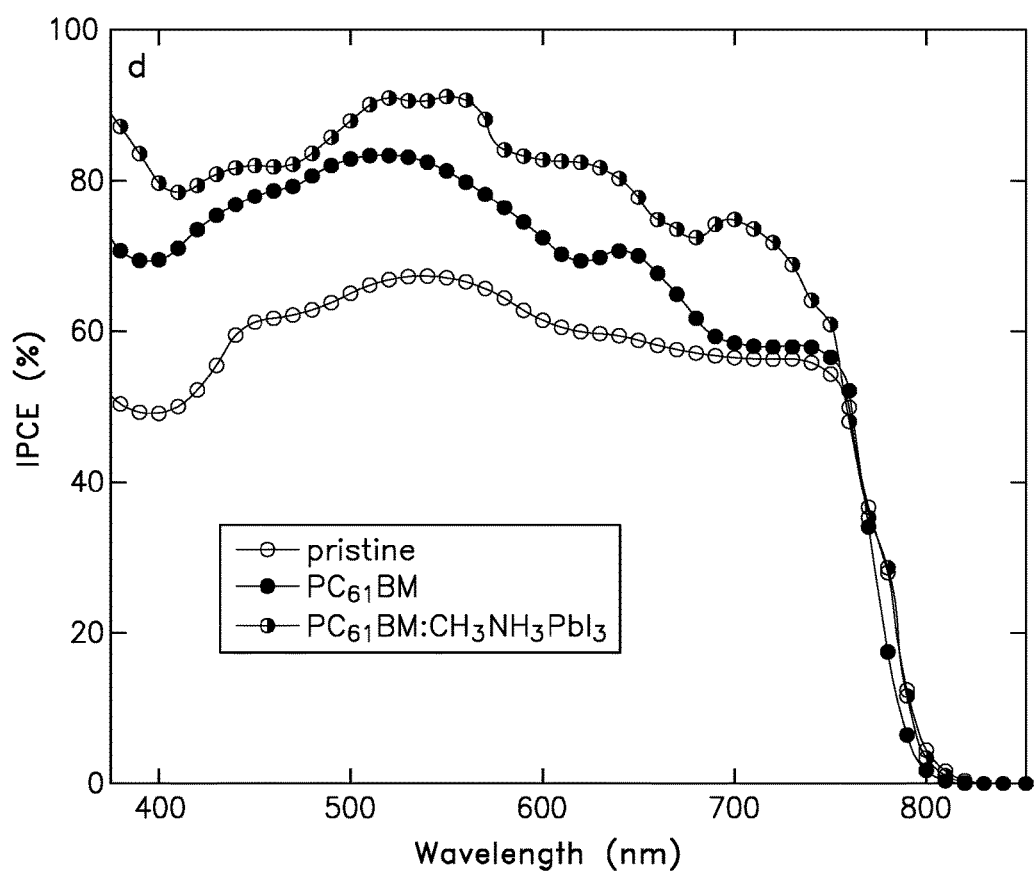
Figure 10A:
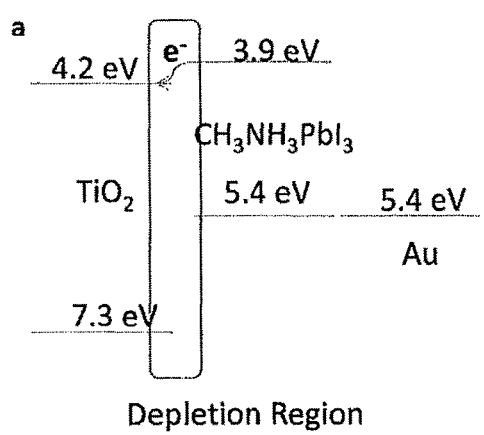
Figure 10B:
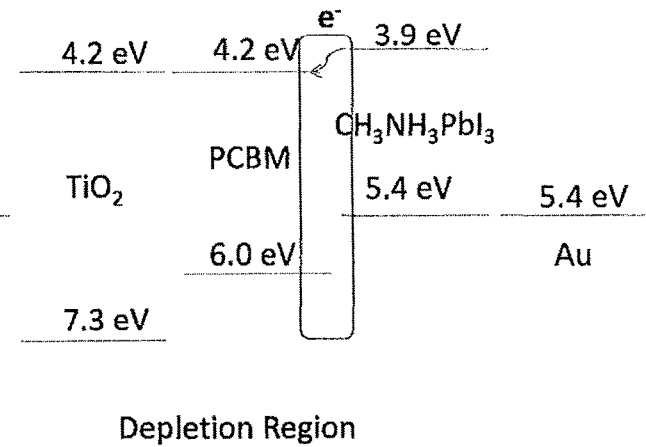
Figure 10C:
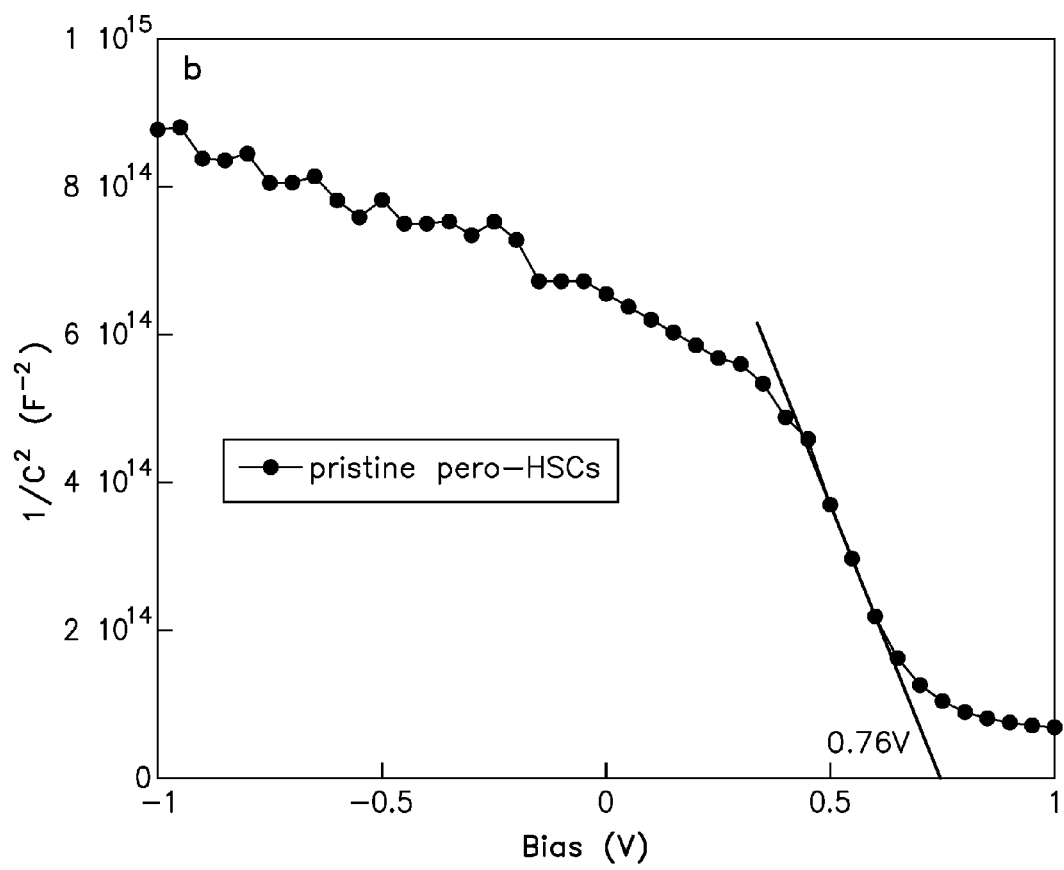
Figure 10D:
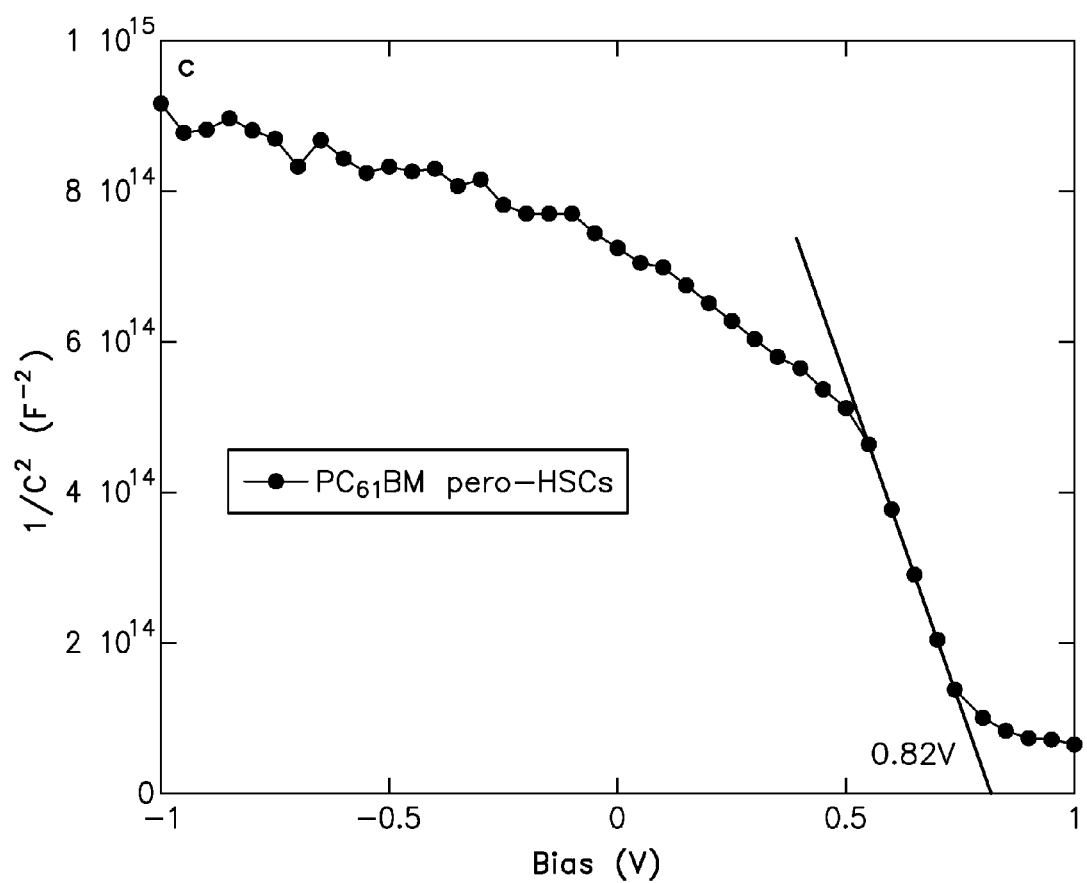
Figure 11:
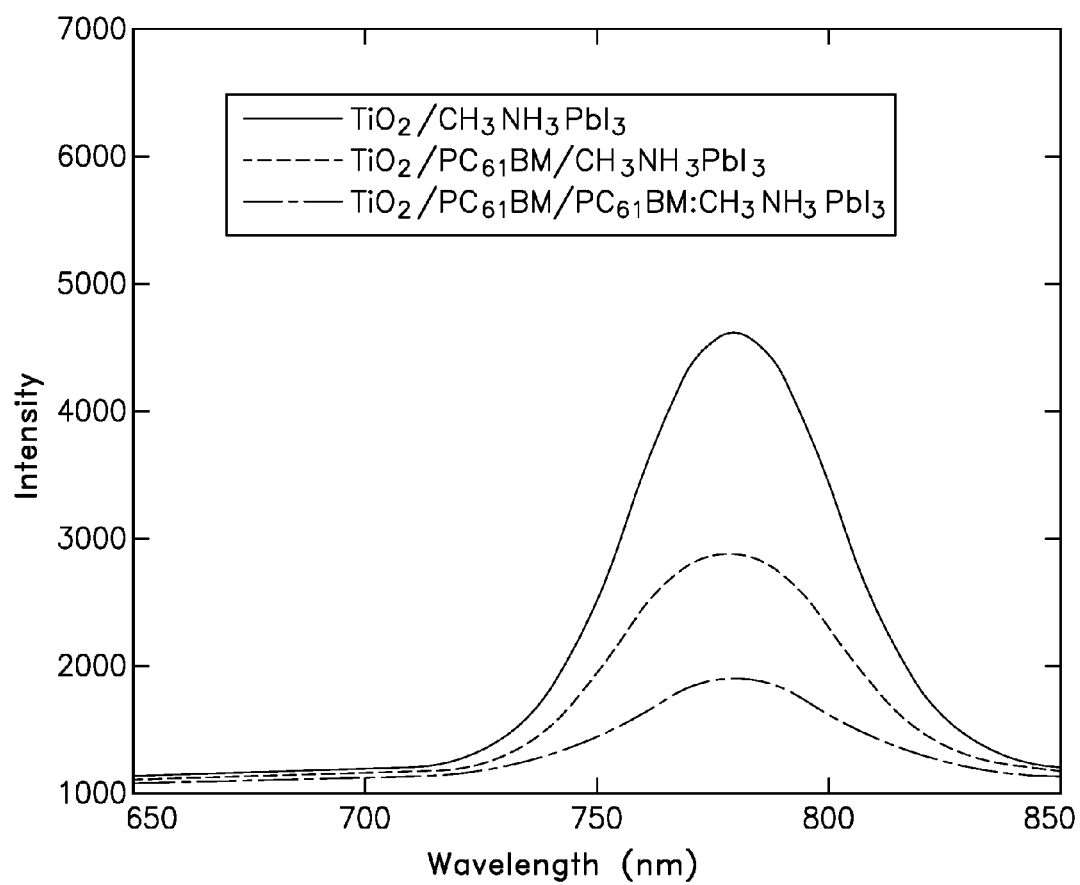
Figure 12:
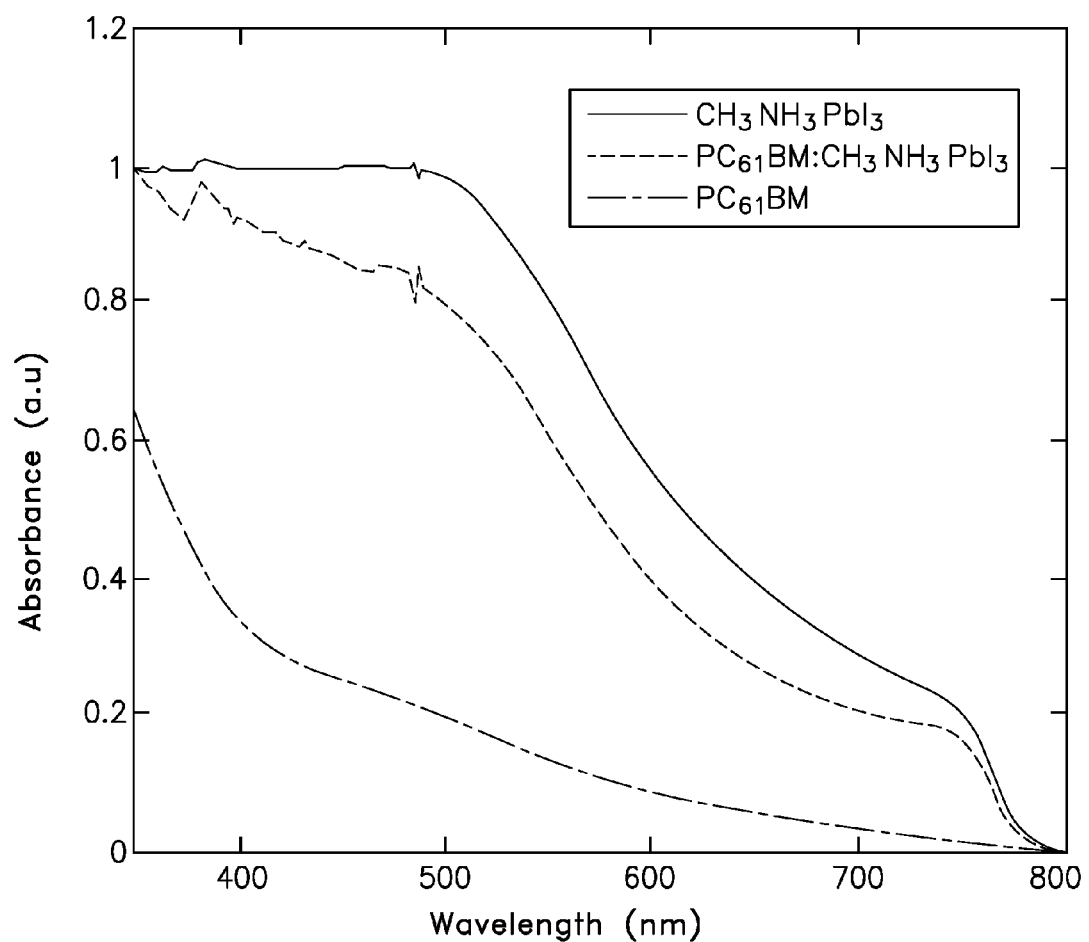
Figure 13A:
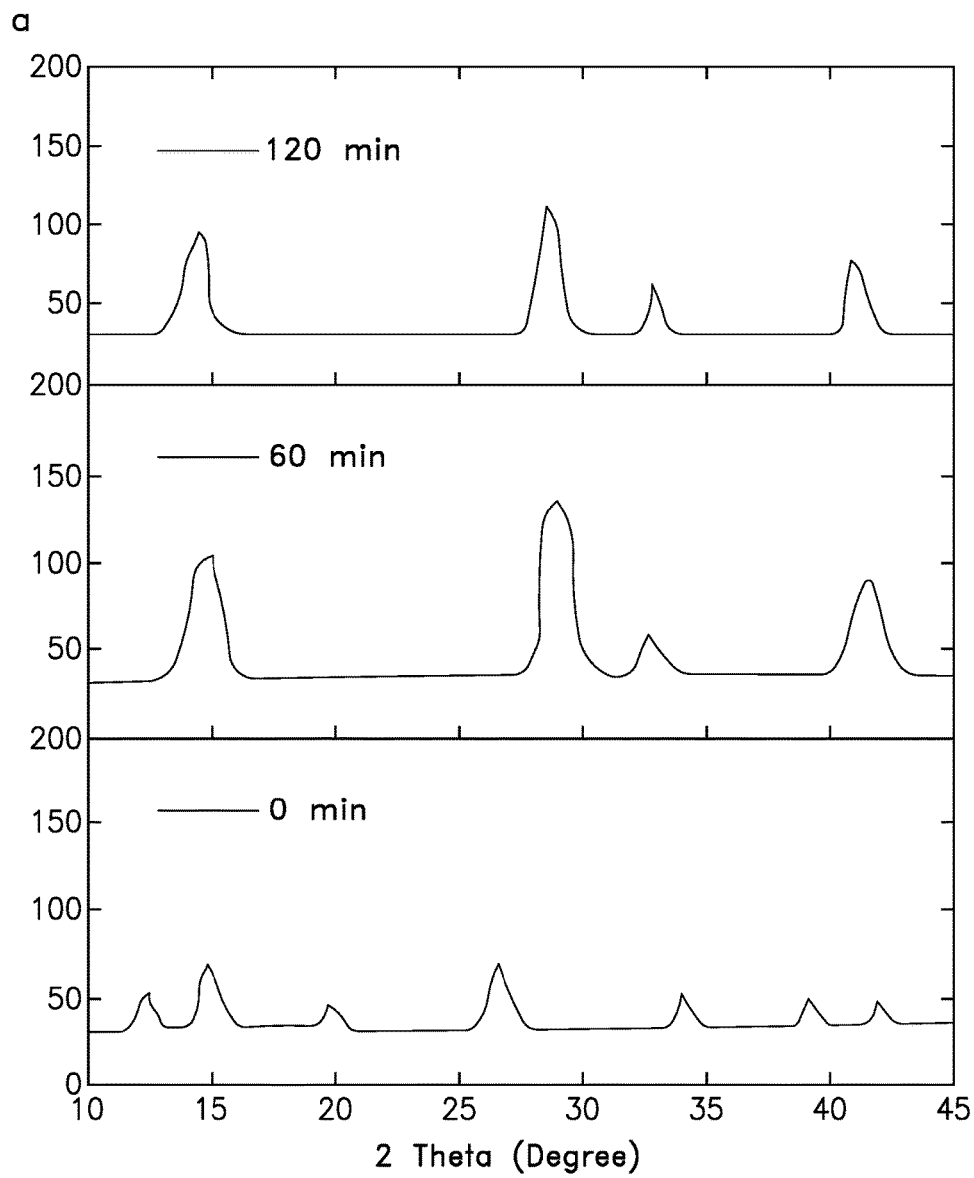
Figure 13B:
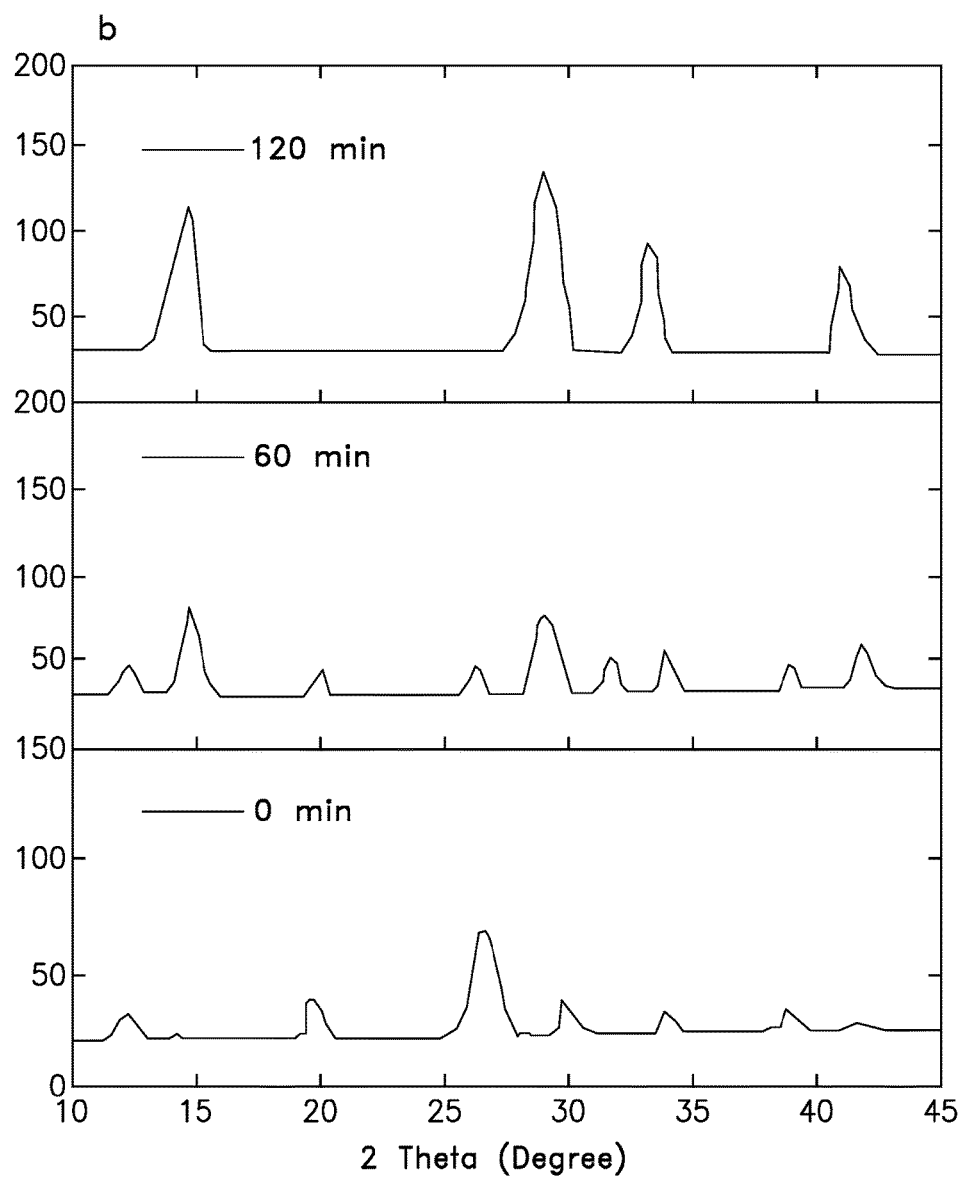
Figure 14A:
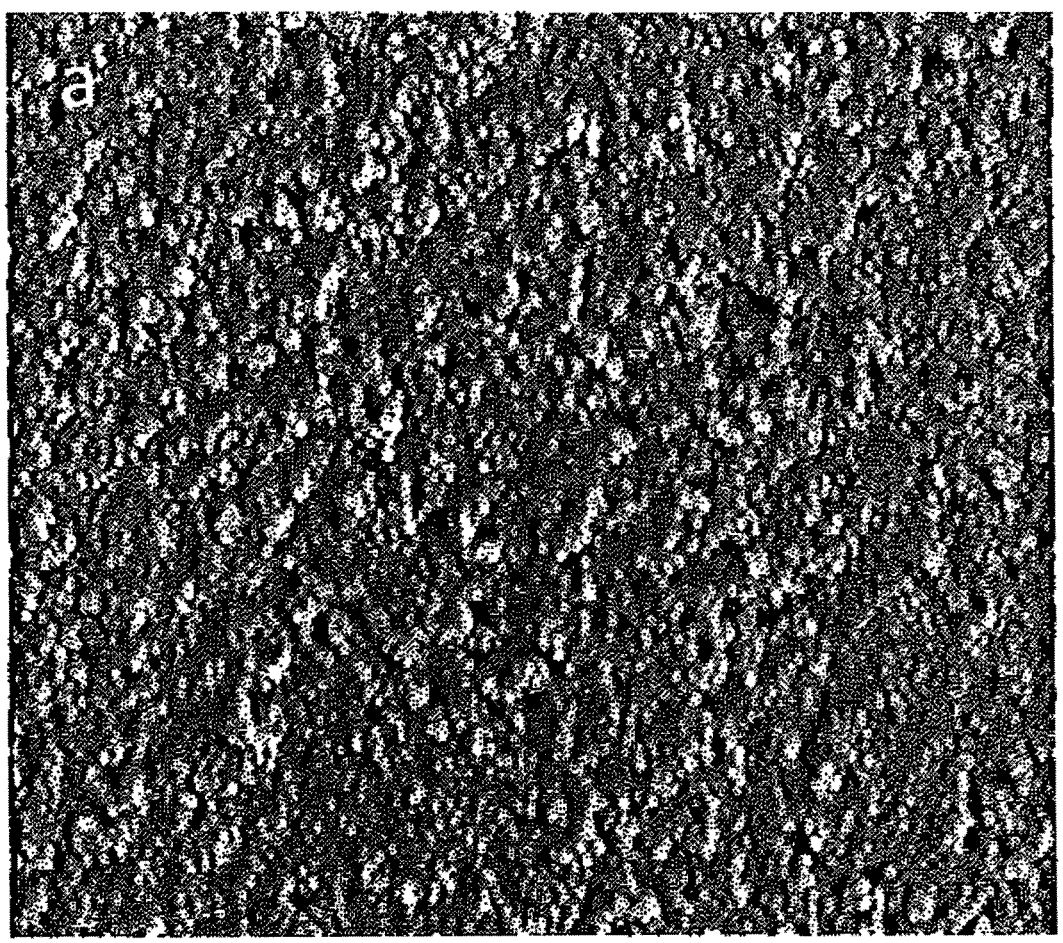
Figure 14B:
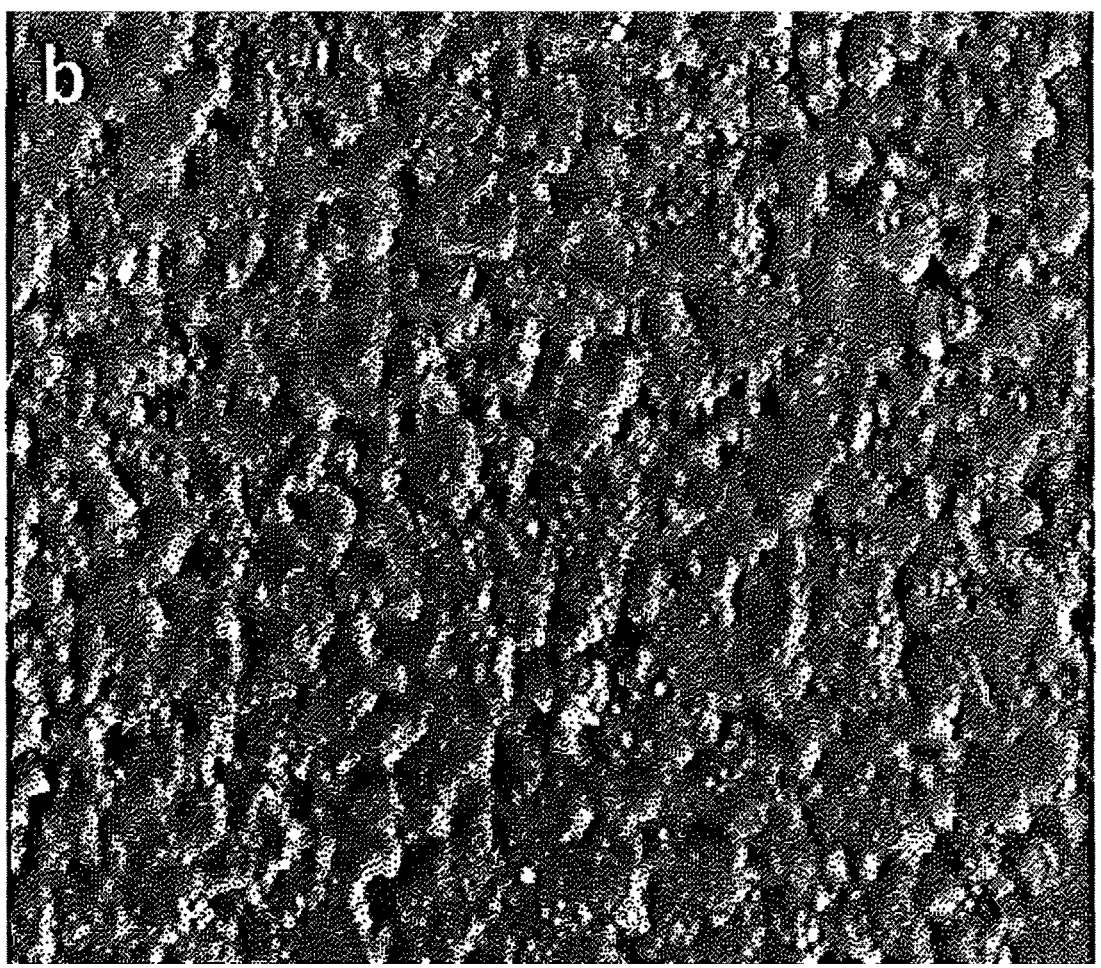
Figure 15:
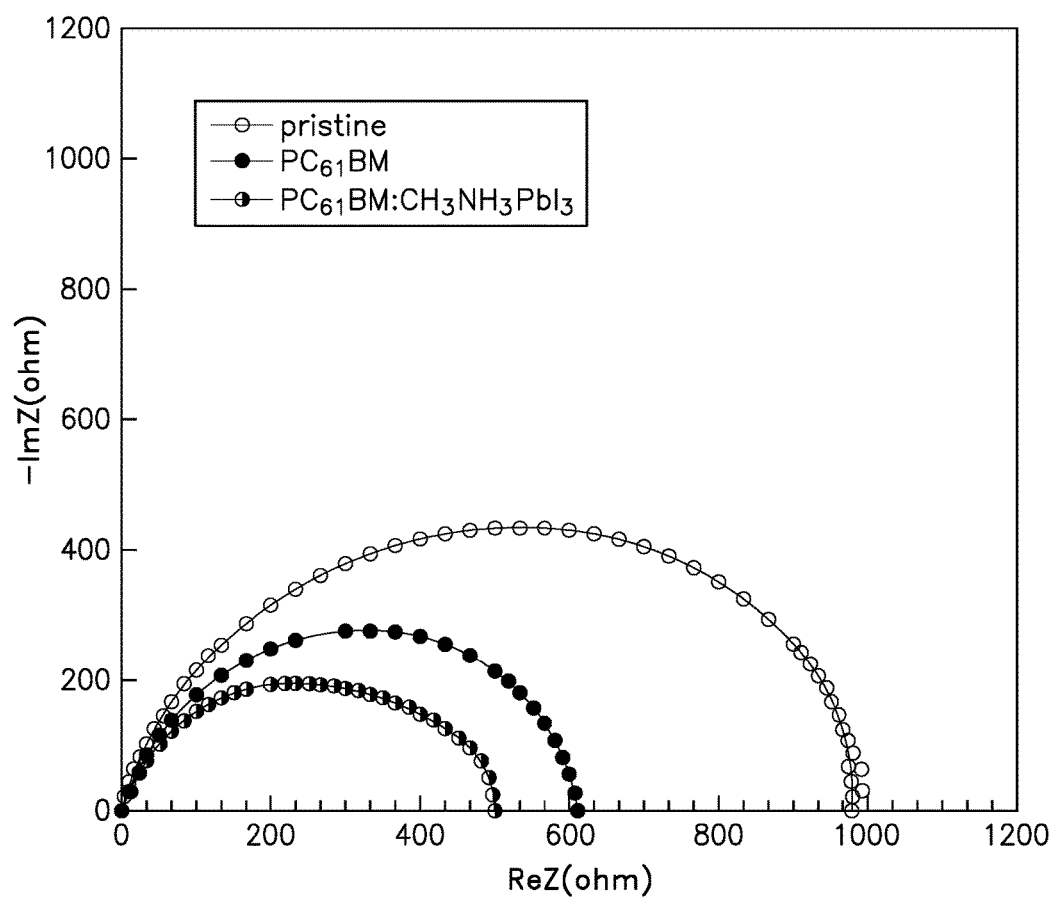

and Device-C has a structure of: ITO/PEDOT:PSS/ CH$_3$NH$_3$PbI$_3$:A$_{10}$C$_{60}$ BHJ composite (prepared from mixed precursor solution)/PC$_{61}$BM/Al in accordance with the concepts of the various embodiments of the present invention;

FIG. 7 is a graph showing the short-circuit current density (Jsc), fill factor (FF) and power conversion efficiency (PCE) of perovskite hybrid solar cells having a structure of ITO/ TiO$_2$/PC$_{61}$BM/PC$_{61}$BM:CH$_3$NH$_3$PbI$_3$/P3HT/MoO$_3$/Al versus weight ratio of PC$_{61}$BM in PbI$_2$ solution in accordance with the concepts of the various embodiments of the present invention;

FIG. 8A is an image showing a contact angle of PbI$_2$ on top of a PC$_{61}$BM layer;

FIG. 8B is an image showing a contact angle of PC$_{61}$BM: PbI$_2$ solution on top of a PC$_{61}$BM layer;

FIG. 9A is a cross-sectional schematic view of another embodiment of a PHJ perovskite hybrid solar cell (pero-HSC) in accordance with the concepts of the various embodiments of the present invention;

FIG. 9B is a cross-sectional schematic view of a BHJ pero-HSC solar cell having an active layer of PC$_{61}$BM: CH$_3$NH$_3$PbI$_3$ in accordance with the concepts of the various embodiments of the present invention;

FIG. 9C is a graph showing current-voltage characteristics of perovskite solar cells having pristine: ITO/TiO$_2$/ CH$_3$NH$_3$PbI$_3$/P3HT/MoO$_3$/Al; PC$_{61}$BM: ITO/TiO$_2$/ PC$_{61}$BM/CH$_3$NH$_3$PbI$_3$/P3HT/MoO$_3$/Al; and Device-C: ITO/TiO$_2$/PCBM/CH$_3$NH$_3$PbI$_3$:PC$_{61}$BM/P3HT/MoO$_3$/Al in accordance with the concepts of the various embodiments of the present invention;

FIG. 9D is a graph showing incident photon to current efficiency (IPCE) spectra of perovskite solar cells having pristine: ITO/TiO$_2$/CH$_3$NH$_3$PbI$_3$/P3HT/MoO$_3$/Al; PC$_{61}$BM: ITO/TiO$_2$/PC$_{61}$BM/CH$_3$NH$_3$PbI$_3$/P3HT/MoO$_3$/ Al; and Device C: ITO/TiO$_2$/PCBM/CH$_3$NH$_3$PbI$_3$: PC$_{61}$BM/P3HT/MoO$_3$/Al in accordance with the concepts of the various embodiments of the present invention;

FIG. 10A is a chart showing energy level alignment of the pristine pero-HSCs having a structure: ITO/TiO$_2$/ CH$_3$NH$_3$PbI$_3$/Au;

FIG. 10B is a chart showing energy level alignment of PC$_{61}$BM pero-HSCs having a structure: ITO/TiO$_2$/PCBM/ CH$_3$NH$_3$PbI$_3$/Au in accordance with the concepts of the various embodiments of the present invention;

FIG. 10C is a Mott-Schottky analysis graph for pristine pero-HSCs having a structure: ITO/TiO$_2$/CH$_3$NH$_3$PbI$_3$/Au;

FIG. 10D is a Mott-Schottky analysis graph of PC$_{61}$BM pero-HSCs having a structure: ITO/TiO$_2$/PCBM/ CH$_3$NH$_3$PbI$_3$/Au in accordance with the concepts of the various embodiments of the present invention;

FIG. 11 is a graph of the photoluminescence (PL) spectra of TiO$_2$/CH$_3$NH$_3$PbI$_3$, TiO$_2$/PC$_{61}$BM/CH$_3$NH$_3$PbI$_3$, and TiO$_2$/PC$_{61}$BM/PC$_{61}$BM:CH$_3$NH$_3$PbI$_3$ films;

FIG. 12 is a graph showing absorption spectroscopy for a CH$_3$NH$_3$PbI$_3$ thin film, a PC$_{61}$BM:CH$_3$NH$_3$PbI$_3$ thin film and a pure PC$_{61}$BM thin film;

FIG. 13A is a graph showing wide angle X-ray diffraction (WAXD) spectra of a pure CH$_3$NH$_3$PbI$_3$ thin film with annealing times of: 0 minutes, 60 minutes, and 120 minutes;

FIG. 13B is a graph showing WAXD spectra of a PC$_{61}$BM:CH$_3$NH$_3$PbI$_3$ thin film under annealing times of: 0 minutes, 60 minutes, and 120 minutes;

FIG. 14A is a top view scanning electron microscope (SEM) image of a CH$_3$NH$_3$PbI$_3$ thin film;

FIG. 14B is a top view SEM image of a PC$_{61}$BM: CH$_3$NH$_3$PbI$_3$ thin film in accordance with the concepts of the various embodiments of the present invention;

FIG. 15 is a graph showing Nyquist plots at V=Voc for perovskite solar cells having pristine: ITO/TiO$_2$/ CH$_3$NH$_3$PbI$_3$/P3HT/MoO$_3$/Al; PC$_{61}$BM: ITO/TiO$_2$/PCBM/ CH$_3$NH$_3$PbI$_3$/P3HT/MoO$_3$/Al; and PC$_{61}$BM:CH$_3$NH$_3$PbI$_3$: ITO/TiO$_2$/PCBM/PC$_{61}$BM:CH$_3$NH$_3$PbI$_3$/P3HT/MoO$_3$/Al in accordance with the concepts of the various embodiments of the present invention, and FIG. 16 shows Table 1 that presents an overview of performance parameters from pero-HSCs of different solar cell architecture-types, precursor solvents and concentrations of water soluble fullerene (ws-fullerene) A$_{10}$C$_{60}$ in a mixed precursor solution.

WRITTEN DESCRIPTION

A perovskite-hybrid solar cell (pero-HSC) in accordance with one or more embodiments of the present invention is generally referred to by numeral 10, as shown in FIG. 1A. The solar cell 10 includes a bulk heterojunction (BHJ) active layer 20, which is formed as a composite or combination of perovskite material, such as methylammonium lead iodide (CH$_3$NH$_3$PbI$_3$) and a fullerene, such as a water soluble fullerene (w-s fullerene), such as 2-oxoacetic acid [60] fullerene (A$_{10}$C$_{60}$), as shown in FIG. 1B. It should be appreciated that in some embodiments, the perovskite material may comprise an n-type perovskite hybrid material. Furthermore, in other embodiments, the fullerene used in the composite may comprise any suitable water-soluble fullerene or non-water soluble fullerene. It should be appreciated that any other suitable perovskite material may be used, such as organometal halide perovskite material, including methyl ammonium lead halide (CH$_3$NH$_3$PbX$_3$, where x=Cl, Br, or I). It should also be appreciated that the perovskite:ws-fullerene composite may be prepared using ethanol as a precursor solvent, in a manner to be discussed. Disposed adjacent, or directly adjacent to one or more surfaces of the active layer 20 is a hole transport layer (HTL) 22, which may be formed of any suitable material, such as poly(3,4-ethylene dioxylene thiophene):poly(styrene sulfonic acid (PEDOT:PSS), for example. However, it should be appreciated that in some embodiments of the solar cell 10, the HTL 22 may include one or more additional layers. In addition, an at least partially light transparent and electrically conductive electrode 40, such as indium-tin-oxide (ITO), is positioned adjacent to the HTL 22, such that in some embodiments it is positioned directly adjacent to the PEDOT:PSS layer. It should be appreciated that in some embodiments, the transparent conductive electrode 40 may also be disposed directly adjacent to an at least partially light transparent substrate (not shown), which may be formed of polyethylene terephthalate (PET), or any, other suitable material. Positioned adjacent, or directly adjacent to one or more other surfaces of the active layer 20 is an electron transport layer (ETL) 42 that is formed of fullerene, such as [6,6]-phenyl-C$_{61}$-butyric acid methyl ester (PC$_{61}$BM), or derivatives thereof, as well any other suitable fullerene. It should also be appreciated that the ETL 42 may also include one or more additional layers. In addition, a conductive electrode 60 is positioned adjacent, or directly adjacent to the ETL 42, such that in some embodiments it is positioned directly adjacent to the fullerene layer. In some embodiments, the conductive electrode 60 may be formed of metal, such as aluminum (Al), calcium (Ca) or gold (Au), as well as any other electrically conductive low-work function metal or material.

In another embodiment of the solar cell 10A, as shown in FIG. 1D, the composite BHJ active layer 20 of solar cell 10 is replaced with a planar heterojunction (PHJ) active layer 20A, which is disposed adjacent, or directly adjacent to planar ETL and HTL layers 22 and 42. In addition, the PHJ active layer 20A includes a planar layer of perovskite material (e.g. $CH_3NH_3PbI_3$), which is formulated using ethanol as a solvent for the perovskite precursor MAI in a manner to be discussed.

It should be appreciated that the term "adjacent" as used herein refers to a configuration in which one layer/component is positioned next to another layer/component but may be separated from such layer/component by one or more intervening layers or components; while the term "directly adjacent" as used herein refers to a configuration in which one layer/component is positioned directly next to another layer/component and is not separated from such layer/component by any other intervening layers or components.

1. Experimental Data

Materials:

Poly(3,4-ethylenedioxythiophene) polystyrene sulfonate (PEDOT:PSS) and [6,6]-phenyl-$C_{61}$-butyric acid methyl ester ($PC_{61}BM$) were purchased from Clevious and 1-Material Inc., respectively and used as received. Lead (II) iodide ($PbI_2$), anhydrous N,N-dimethylformamide (DMF), ethanol (99.5%), isopropyl alcohol (99.7%), hydroiodic acid (99.99%), and methylamine were purchased from Sigma-Aldrich and used as received without further purification. The water soluble fullerene (ws-fullerene) $A_{10}C_{60}$ and methylammonium iodide (MAI) were synthesized in accordance with known techniques.

Precursor Preparation:

$PbI_2$ was first dissolved in DMF to yield a light yellow solution with a concentration of about 400 mg/ml. After stirring at about 70° C. over approximately 12 hours, the solution was left to sit overnight to achieve a clear supernatant. The MAI was then dissolved in isopropanol (MAI-isopropanol) and ethanol (MAI-ethanol), respectively, to achieve colorless solutions with a concentration of about 35 mg/ml. In addition, a mixed MAI precursor solution was prepared by simultaneously dissolving $A_{10}C_{60}$ and MAI (MAI-$A_{10}C_{60}$) in ethanol to achieve a pink solution. The concentration of MAI in the mixed precursor solution is 35 mg/ml; the concentration of $A_{10}C_{60}$ in the mixed solution was controlled from 2.5 mg/ml to 20 mg/ml.

Perovskite Film Preparation:

The $CH_3NH_3PbI_3$ films were prepared using a two-step solution deposition process. In particular, the $PbI_2$ supernatant and the substrate was pre-heated to about 70° C. for about 5 minutes. Next, the $PbI_2$ supernatant solution was spin-coated on top of the substrate with a spin-rate of about 300 RPM (revolutions per minute) for about 25 seconds, followed by post-heating at about 70° C. for about 10 minutes. Subsequently, after the films were heated, they were cooled to room temperature, the MAI-isopropanol, MAI-ethanol and mixed MAI-$A_{10}C_{60}$ solution were then each spin cast on top of $PbI_2$ coated substrates, respectively, at a spin-rate of about 3000 RPM (revolutions-per-minute) for about 25 seconds, and then annealed at about 100° C. for approximately 2 hours.

Pero-HSCs Fabrication:

All PHJ pero-HSCs were fabricated on a pre-cleaned ITO coated glass substrate. After the ITO substrates were treated with UV-ozone for about 20 minutes under an ambient atmosphere, a ~40 nm thick film of PEDOT:PSS was cast on top of ITO, followed with thermal annealing at about 150° C. for approximately 10 minutes. Next, the $CH_3NH_3PbI_3$ thin films, designated as PHJ Film-A, PHJ Film-B and BHJ Film-C were prepared via the two-step deposition process described above in order to achieve an identical film thickness of ~300 nm. In addition, an about 100 nm thick layer of electron selective contact $PC_{61}BM$ was deposited from a solution of $PC_{61}BM$ in chlorobenzene. Finally, a 100-nm-thick aluminum electrode was thermally deposited on top of the $PC_{61}BM$ layer in a vacuum with a base pressure of about $6\times10^{-6}$ mbar through a shadow mask. The device area was measured to be about 0.045 $cm^2$.

Perovskite Film Characterization:

The absorption spectra of the perovskite films coated on ITO/glass substrates were measured using an HP 8453 UV-vis (ultraviolet-visible) spectrophotometer. The SEM (scanning electron microscope) images were obtained by using a field emission scanning electron microscope (JEOL-7401). The AFM (atomic force microscopy) images were obtained using a NanoScope NS3A system (Digital Instrument) to observe the surface morphologies and thicknesses of various thin films. XRD (X-ray diffraction) patterns of the perovskite films coated on PET substrates were obtained using a Bruker AXS Dimension D8 X-Ray System. The PL (photoluminescence) photons were counted by a Picoharp 300 after preamplification by PAM 102.

Pero-HSCs Characterization:

The J-V characteristics of pero-HSCs were obtained by using a Keithley model 2400 source measure unit. A Newport Air Mass 1.5 Global (AM1.5G) full-spectrum solar simulator was applied as a light source. The light intensity was about 100 mW $cm^{-2}$, which was calibrated by utilizing a monosilicon detector (with a KG-5 visible color filter) from National Renewable Energy Laboratory to reduce the spectral mismatch. The incident photon-to-current efficiency (IPCE) was measured through an IPCE measurement setup in use at the European Solar Test Installation (ESTI) for solar cells and mini-modules. A 300 W steady-state xenon lamp provided the source light. Up to 64 filters (8 to 20 nm width, ranging from 300 to 1200 nm) were available on four filter-wheels to produce the monochromatic input, which is chopped at about 75 Hz, superimposed on the bias light and measured via a typical lock-in technique. Bias light is necessary to place the device under examination close to the operating irradiance condition. After collecting the IPCE data, the software also integrated the data with the AM1.5G spectrum simulator and provided the calculated $J_{SC}$ value. Impedance spectra (IS) was obtained using an HP 4194A impedance/gain-phase analyzer, all under illumination, with an oscillating voltage of about 10 mV and a frequency of about 1 Hz to 1 MHz. The polymer solar cells (PSCs) were held at their respective open circuit potentials, which were obtained from the J-V measurements, while the impedance spectrum (IS) was being recorded.

Results:

FIGS. 1A and 1D show the structure of both planar heterojunction (PHJ) and bulk heterojunction (BHJ) and planar heterojunction (PHJ) solar cell device structures 10 and 10A, respectively. In addition, FIG. 1B shows the chemical structure of water soluble fullerene (ws-fullerene) $A_{10}C_{60}$, while FIG. 1C shows the crystal structure of the $CH_3NH_3PbI_3$ perovskite material used by the devices 10 and 10A. In particular, a naked fullerene head was regiospecifically functionalized with ten carboxylic acid groups, imparting hydrophilicity on the surface of the fullerene. The resulting water soluble fullerene (ws-fullerene) $A_{10}C_{60}$ showed excellent solubility in a polar solvent, such as methanol and ethanol. By mixing $A_{10}C_{60}$ and MAI in ethanol, followed by the two-step solution deposition process, a dark purple, super smooth BHJ composite film of perovskite:fullerene was obtained, hereinafter referred to as "film-C" (device 10). In comparison, the pure perovskite film sequentially-deposited from MAI/ethanol precursor solution was also prepared, hereinafter referred to as "film-B" (device 10A). The previously reported perovskite film prepared from MAI/isopropanol solution is referred to herein as "film-A". Using film-A and film-B in pero-HSCs gives rise to PHJ pero-HSCs having a device structure of ITO/PEDOT:PSS/film-A or film-B/PC$_{61}$BM/Al, as shown in FIG. 1D in the case of film-B. In addition, using film-C in pero-HSCs gives rise to a BHJ pero-HSC with a structure of ITO/PEDOT:PSS/CH$_3$NH$_3$PbI$_3$:A$_{10}$C$_{60}$ BHJ composite (film-C)/PC$_{61}$BM/Al, as shown in FIG. 1A.

Figure 2A:
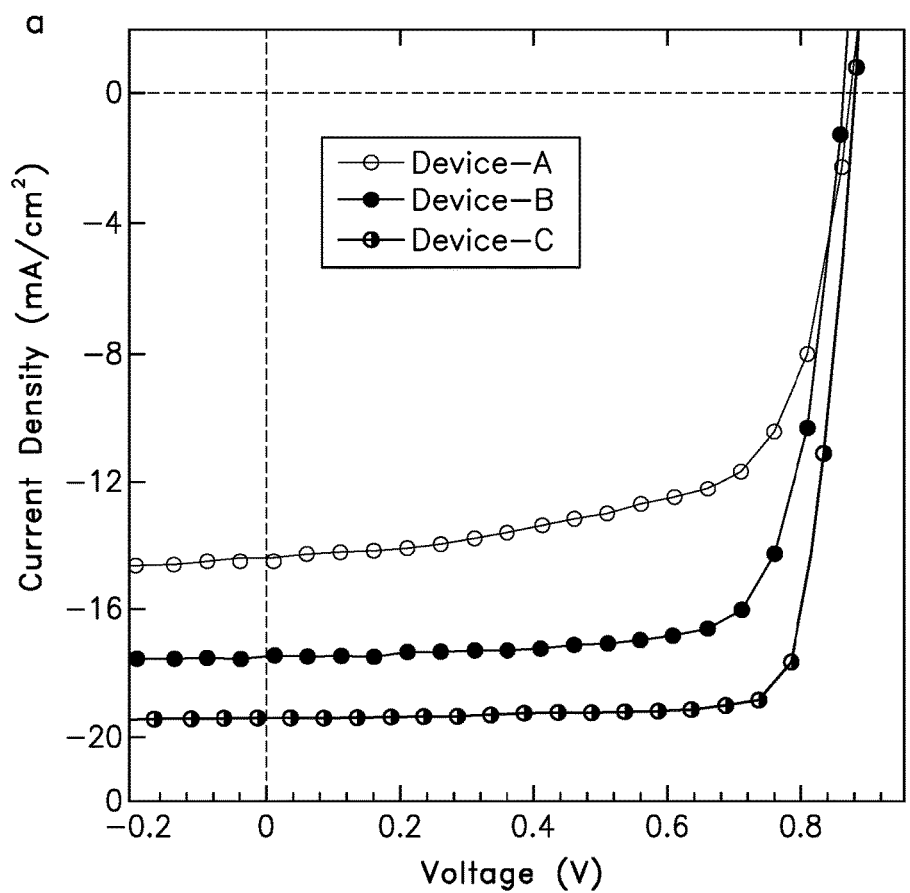
FIG. 2A is a graph showing the J-V characteristics of pero-HSCs under AM 1.5 simulated illumination.

The J-V characteristics were analyzed to identify the influence from the precursor solution of mixed solute and different solvents on the performance of the solar cell. FIG. 2A illustrates the photocurrent of different devices. The control device (film-A), which utilizes isopropanol prepared CH$_3$NH$_3$PbI$_3$ perovskite showed an average efficiency of 8.21% with a V$_{OC}$ of 0.88 V, J$_{SC}$ of 14.38 mA/cm$^2$ and a FF of 64.8%, which is comparable to the reported 8.92% in a similar device structure. By replacing isopropanol with stronger polar ethanol, device-B (device 10A, FIG. 1D) exhibited an average efficiency of 11.45% with a V$_{OC}$ of 0.86 V, J$_{SC}$ of 17.31 mA/cm$^2$ and a FF of 77.2%. Using ethanol eventually gave a much smoother CH$_3$NH$_3$PbI$_3$ perovskite film, which was observed by the naked eye to indicate that passivated traps and fewer pinholes existed at the perovskite/PC$_{61}$BM interface afterwards. This, together with a higher fill factor (FF) value, allows it to be inferred that a reduced shunt resistance in device-B can be obtained, particularly a reduced parasitic resistance at the perovskite/PC$_{61}$BM PHJ interface. In addition, improved contact in the PHJ interface leads to improvements in electron extraction or transport from the CH$_3$NH$_3$PbI$_3$ layer to the PC$_{61}$BM layer, thus resulting in an enhanced J$_{SC}$. On the other hand, device-C (device 10A, FIG. 1A), utilizing a BHJ structure, showed an even higher J$_{SC}$ of 19.41 mA/cm$^2$ and FF of 81.6%, corresponding to an enhanced PCE of 13.97%. The high value of 81.6% suggests a more balanced charge carrier mobility in the BHJ composite active area. And by tuning the concentration of the water soluble fullerene A$_{10}$C$_{60}$ in the mixed precursor solution, a higher fill factor (FF) of 86.7% was obtained in device-C, as shown in Table 1. As such, the obtained FF is believed to be the highest value among all reported pero-HSCs thus far. Furthermore, Table 1 presents an overview of the performance parameters from pero-HSCs of different solar cell architecture-types, precursor solvents and concentrations of water soluble fullerene (ws-fullerene) A$_{10}$C$_{60}$ in mixed precursor solution. It is found that the introduction of ws-fullerene generally enlarged the power conversion efficiency (PCE). In device-C, by increasing the concentration of A$_{10}$C$_{60}$ there is a continuing increase in J$_{SC}$; whereas the FF showed an initial increase, followed by a decrease. The J$_{SC}$ and FF are closely related to the film morphology of the BHJ composite active are, which is similar to that of polymer solar cells. By tuning the ratio of MAI:A$_{10}$C$_{60}$ in the precursor solution, the reaction between MAI and PbI$_2$ will also be influenced in different scales, because the additional A$_{10}$C$_{60}$ can be seen as an inert impurity here.

Figure 2B:
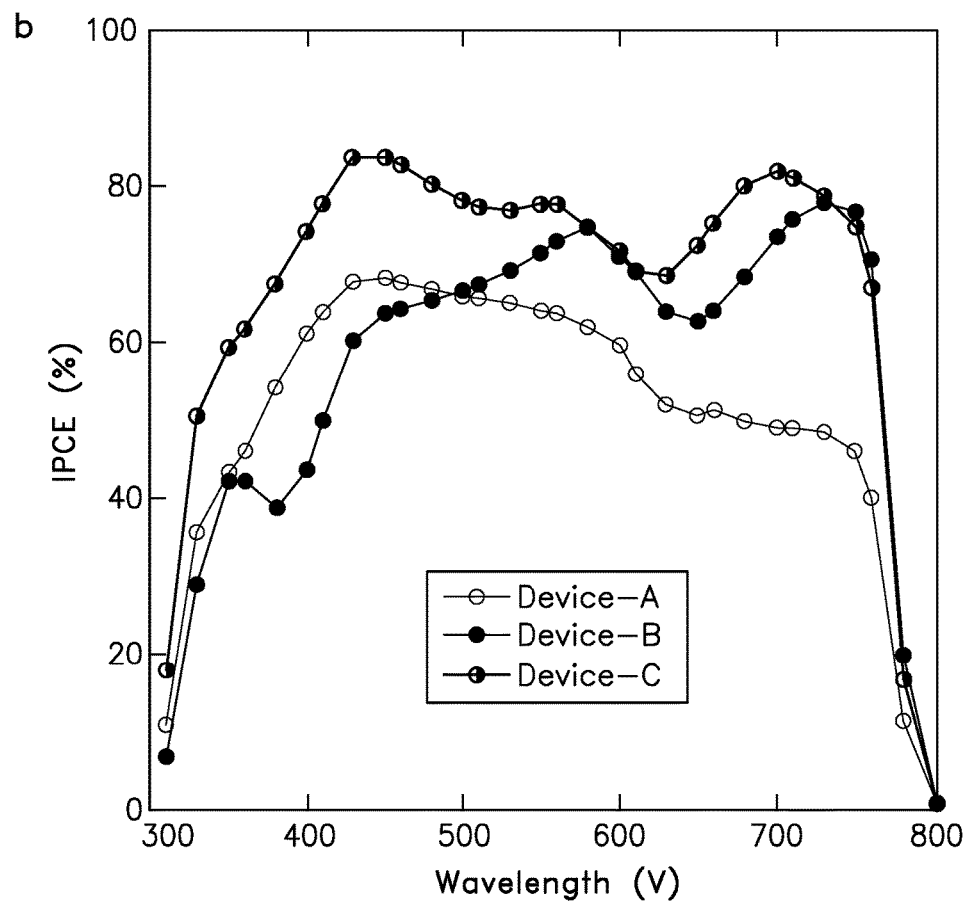
FIG. 2B is a graph showing incident photon to current efficiency (IPCE) spectra of pero-HSCs, whereby Device-A has a PHJ structure of ITO/PEDOT:PSS/$CH_3NH_3PbI_3$/$PC_{61}BM$/Al, where $CH_3NH_3PbI_3$ is prepared from MAI-isopropanol solution: Device-B has a PHJ structure of ITO/PEDOT:PSS/$CH_3NH_3PbI_3$/$PC_{61}BM$/Al, where $CH_3NH_3PbI_3$ is prepared from MAI-ethanol solution, and Device-C has a structure of ITO/PEDOT:PSS/$CH_3NH_3PbI_3$:$A_{10}C_{60}$/$PC_{61}BM$/Al, where BHJ composite, $CH_3NH_3PbI_3$:$A_{10}C_{60}$ is prepared from the mixed solution of MAI-$A_{10}C_{60}$-ethanol in accordance with the concepts of the various embodiments of the present invention.

The incident photon to current efficiency (IPCE) spectra of the three devices A, B and C is presented in FIG. 2B, which specifies the ratio of extracted electrons to incident photons at a given wavelength. The photocurrent generation starts at about 800 nm for all three devices, which is in good agreement with the band gap (E$_g$=1.55 eV) of CH$_3$NH$_3$PbI$_3$ perovskite. Device-A showed a wide response in the visible to the near-infrared region, achieving over ~60% in the 400-600 nm range. The use of ethanol in device-B/device 10A gave a noticeable improvement to the photocurrent over the visible region between 500 to 800 nm and a unique response peak approaching ~80% at ~730 nm. Finally, with the incorporation of water soluble fullerene (ws-fullerene), device-C/device 10 exhibited a stronger spectral response over the entire visible to near infrared region with the highest efficiency of over 85%. In contrast to device-B/device 10A, an obvious enhancement of the response was manifested in the region from 350-450 nm, which most likely originated from the contribution of fullerene in the BHJ active layer of device-C/device 10. The integrated current from each spectra is 14.14 mA/cm$^2$, 17.21 mA/cm$^2$, 19.03 mA/cm$^2$ for devices A, B and C, respectively, which is consistent with the J$_{SC}$ obtained from the J-V curve.

Figure 3A:
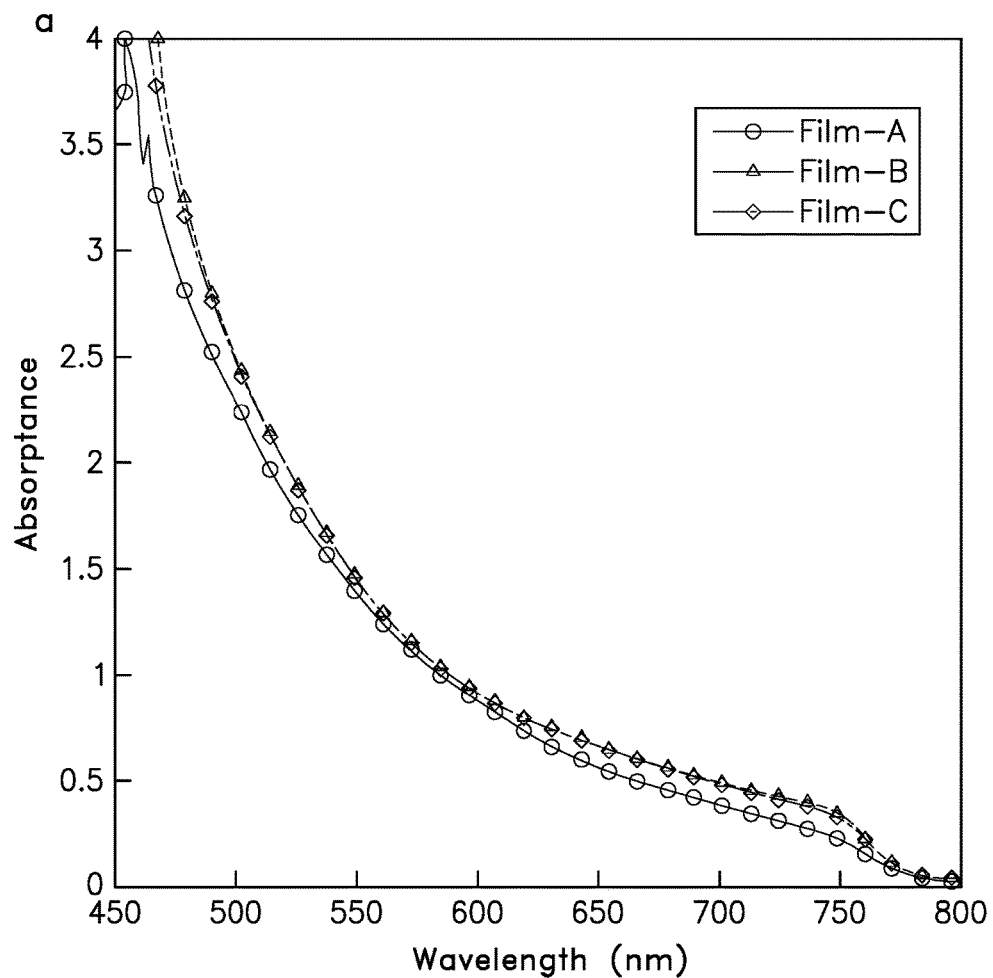
FIG. 3A is a graph showing the UV-vis (ultraviolet-visible) absorption spectra of a $CH_3NH_3PbI_3$ perovskite layer that was prepared from isopropanol solution (Film/Device-A), a $CH_3NH_3PbI_3$ layer prepared from ethanol solution (Film/Device-B), and a $CH_3NH_3PbI_3$:$A_{10}C_{60}$ BHJ composite layer (Film/Device-C) prepared from ethanol solution in accordance with the concepts of the various embodiments of the present invention.
Figure 3B:
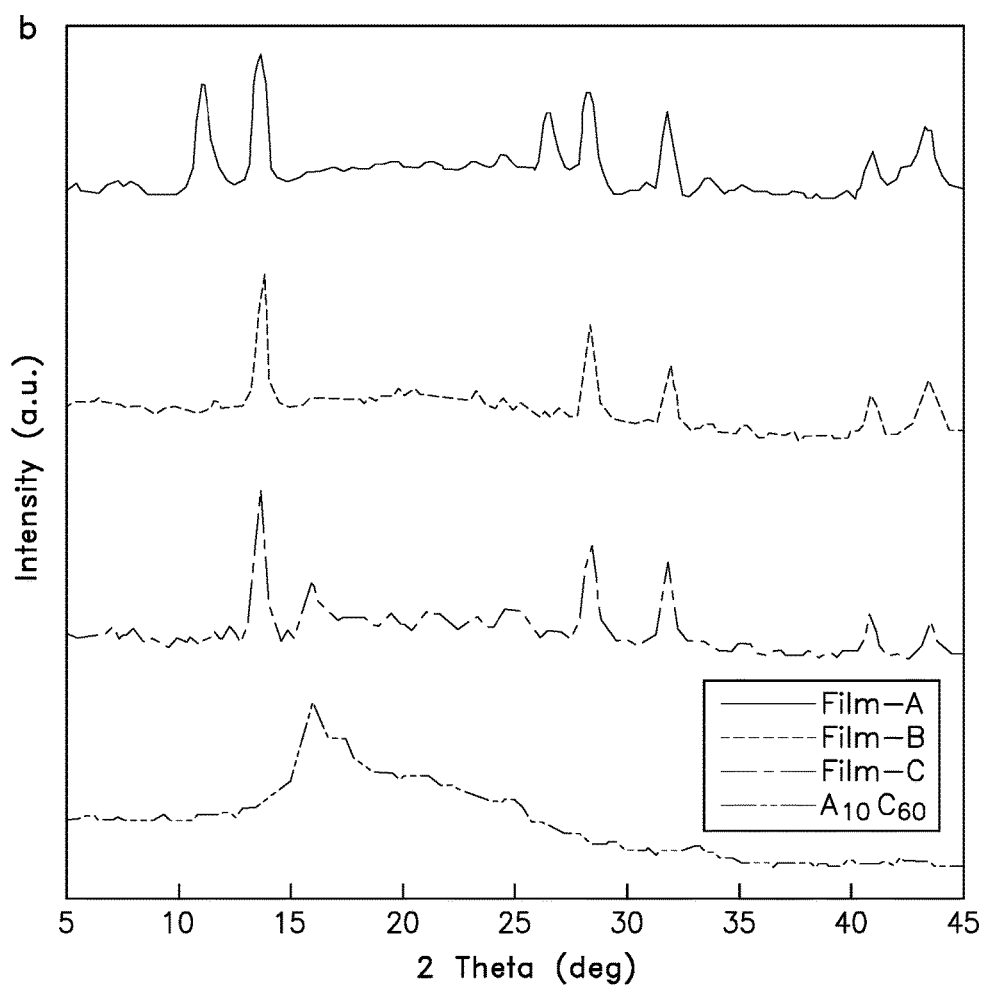
FIG. 3B is a graph showing X-ray diffraction (XRD) patterns of the $CH_3NH_3PbI_3$ perovskite layer that was prepared from isopropanol solution (Film/Device-A), the $CH_3NH_3PbI_3$ perovskite layer that was prepared from ethanol solution (Film/Device-B), the $CH_3NH_3PbI_3$:$A_{10}C_{60}$ BHJ composite layer (Film/Device-C) that was prepared from ethanol solution, and an XRD pattern of a water-soluble fullerene $A_{10}C_{60}$ thin film in accordance with the concepts of the various embodiments of the present invention.

To analyze the differences in photovoltaic performance of the three devices A, B (device 10A) and C (device 10), UV-Vis (ultra-violet visible) absorption spectra and X-ray diffraction (XRD) analyses were carried out. All of the perovskite films exhibit an absorption profile extending to 800 nm, as shown in FIG. 3A. Film-A showed an absorption coefficient ε (absorbance divided by the film thickness) of 4.6×10$^4$ cm$^{-1}$ at 550 nm; film-B showed an ε$_{550\ nm}$ of 5.3×10$^4$ cm$^{-1}$; and film-C showed an ε$_{550\ nm}$ of 5.7×10$^4$ cm$^{-1}$. A high absorption coefficient ε indicates a dense film of perovskite. The use of ethanol leads to denser film, which is attributed to a compact stacking pattern, complete conversion, surface coverage, or different crystalline. The slight increase of ε$_{550\ nm}$ from film-B to film-C may result from the A$_{10}$C$_{60}$ induced morphological change. FIG. 3B presents the XRD patterns of both films A, B, and C, as well as A$_{10}$C$_{60}$. The main diffraction peaks at 13.9°, 28.5°, 32.0°, 40.6°, and 43.6°, which are assigned to the (110), (220), (310), (224) and (314) planes, which are identical positions for all three films, indicate that the halide perovskite possesses an orthorhombic crystal structure. Film-A exhibits two representative peaks for PbI$_2$, indicating the PbI$_2$ precursor layer was not completely converted into CH$_3$NH$_3$PbI$_3$ crystals. While using ethanol as the precursor solvent, no unreacted PbI$_2$ was detected in the final perovskite film. The pure A$_n$C$_{60}$ also showed crystals since there is a small characteristic peak around 17°. And the characteristic peak of A$_n$C$_{60}$ was also obtained in film-C although the intensity is relatively low, implying small-scale A$_{10}$C$_{60}$ crystalline in the BHJ composite. Moreover, film-C/device 10 showed a higher diffraction intensity at a peak of 32.0° than that of film-B, indicating highly crystalline in film-C. In conclusion, the use of ethanol allows the reaction between MAI and PbI$_2$ to be more complete, giving rise to a denser film; the introduction of A$_{10}$C$_{60}$ changes the morphology of the BHJ composite as well as the crystalline degree.

Figures 4A, 4B, 4C, 4D, 4E, 4F:
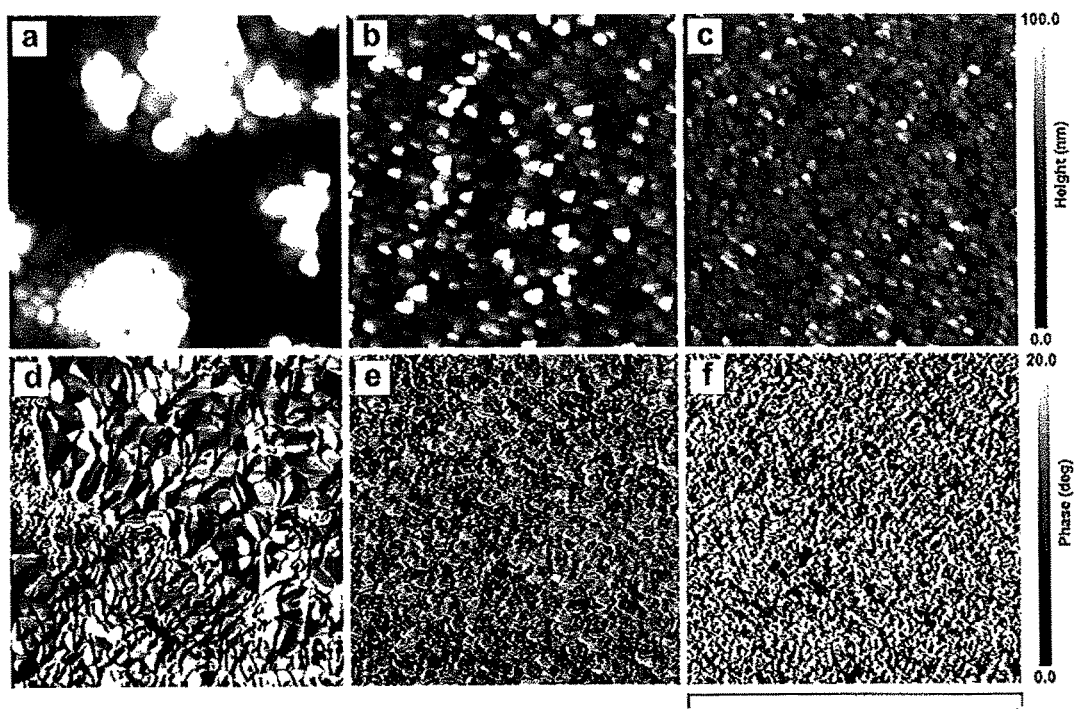
FIG. 4A is a tapping mode atomic force microscopy (AFM) height image of a $CH_3NH_3PbI_3$ perovskite layer prepared from isopropanol solution.
FIG. 4B is a tapping mode atomic force microscopy (AFM) height image of a $CH_3NH_3PbI_3$ perovskite layer prepared from ethanol solution in accordance with the concepts of the various embodiments of the present invention.
FIG. 4C is a tapping mode atomic force microscopy (AFM) height image image of a $CH_3NH_3PbI_3$:$A_{10}C_{60}$ BHJ composite layer prepared from ethanol solution in accordance with the concepts of the various embodiments of the present invention.
FIG. 4D is a tapping mode atomic force microscopy (AFM) phase image of a $CH_3NH_3PbI_3$ perovskite layer prepared from isopropanol solution.
FIG. 4E is a tapping mode atomic force microscopy (AFM) phase image of a $CH_3NH_3PbI_3$ perovskite layer prepared from ethanol solution in accordance with the concepts of the various embodiments of the present invention.
FIG. 4F is a tapping mode atomic force microscopy (AFM) phase image image of a $CH_3NH_3PbI_3$:$A_{10}C_{60}$ BHJ composite layer prepared from ethanol solution in accordance with the concepts of the various embodiments of the present invention.

To inspect the morphological difference between each perovskite-based films A, B (device 10A) and C (device 10), both atomic force microscopy (AFM) images and top view scanning electron microscopy (SEM) images were obtained. In particular, FIGS. 4A-C show the AFM topographic height images for films A, B, and C respectively, while FIGS. 4D-F show the AFM phase images for films A, B, and C respectively. The isopropanol prepared film-A exhibited a large root-mean-square (RMS) roughness (Rq) of about 76.56 nm, although some crystals have larger dimensions of micrometer scale. It should be noted that the top PC$_{61}$BM layer has a thickness of only ~100 nm, which is too thin to completely cover the whole perovskite layer in film-A. Thus, a direct contact between film-A and the top electrode Al would be expected due to the large roughness depth of film-A. And such, direct contact would give rise to a non-geminate recombination between carriers from the perovskite layers and the Al electrode, decreasing the efficiency. In contrast, film-B showed a smoother surface with a dramatically decreased Rq of 10.58 nm in FIG. 4B. And the flat surface suggests a complete coverage of $PC_{61}BM$ layer afterwards, avoiding direct contact between the perovskite and the cathode. In addition, the crystal domain size is also reduced to a uniform scale of ~200 nm. The small Rq means a smoother surface with less sharp traps and pinholes, thus leading to improved contact between the perovskite and the $PC_{61}BM$ layer. In this way, electron extraction efficiency is elevated, which was proved by the increased $J_{SC}$ and FF of device-B. The morphological change from film-A to film-B/device 10A is dominated by the utilization of strong-polar ethanol with a polarity index of 5.2, which is higher than 3.9 of isopropanol. During the chemical reaction, the existence of polar solvent can offer additional Van der Waals interaction (typically 0.4-4 kJ/mol) with each reactant. Given that the orthorhombic crystal structure of perovskite is metastable with weak hydrogen bonds between amino groups and halide ions and Van der Waals bonds between each MA group, therefore the polar solvent induced weak interactions eventually affects the morphology of the final perovskite film in different scales. Moreover, the mechanism is more complicated when the ws-fullerene is introduced into the ternary system. As a result, film-C/device 10 showed a similar height image to that of film-B but a slightly higher Rq of 15.46, which is most likely due to the introduction of ws-fullerene. And the crystal domain size is smaller, implying a denser and more compact film. Comparing the phase image of film-B and film-C, as shown in FIGS. 4E and 4F, a binary phase blend pattern of perovskite:ws-fullerene was visualized in film-C, which is similar to that of polymer: fullerene bi-continuous BHJ composite in PSCs. The BHJ interpenetrating network here is essential for efficient electron extraction, because (1) the enlarged interface area facilitates more exciton dissociation at the interface, and (2) more free electrons are able to be injected into n-type semiconductors due to decreased travel length. Consequently, electron extraction efficiency is improved, so as to be comparable with that of hole extraction efficiency, such that the more balanced carrier extraction, results in a larger fill factor (FF).

FIGS. 5A-C provide a comparison of top-view SEM images between each film A, B (device 10A) and C (device 10). As shown in FIG. 5A, the isopropanol prepared film-A showed a rough surface with long wrinkles, which is inconsistent with the large Rq in the AFM measurements. In contrast, the ethanol prepared film-B showed a smoother surface and the blended film-C exhibited a similar surface morphology, as shown in FIGS. 5B and 5C, respectively. There are voids observed in film-B, while in film-C the sizes of the voids are minimized, but the number of such voids is increased. It is speculated that by introducing the ws-fullerene, the original large voids were filled and a new phase of ws-fullerene makes the composite material more compact. FIG. 5C also presents a bi-continuous network pattern, which is in agreement with FIG. 4F. The inset images in FIGS. 5A-C present higher resolution images with a magnification of ×50,000. It is clear that the crystal size gradually increases from film-A to film-B to film-C. And in FIG. 5C, there are two sizes of particles observed in film-C, one is perovskite crystal and another is the aggregation domain of ws-fullerene.

Figure 6A:
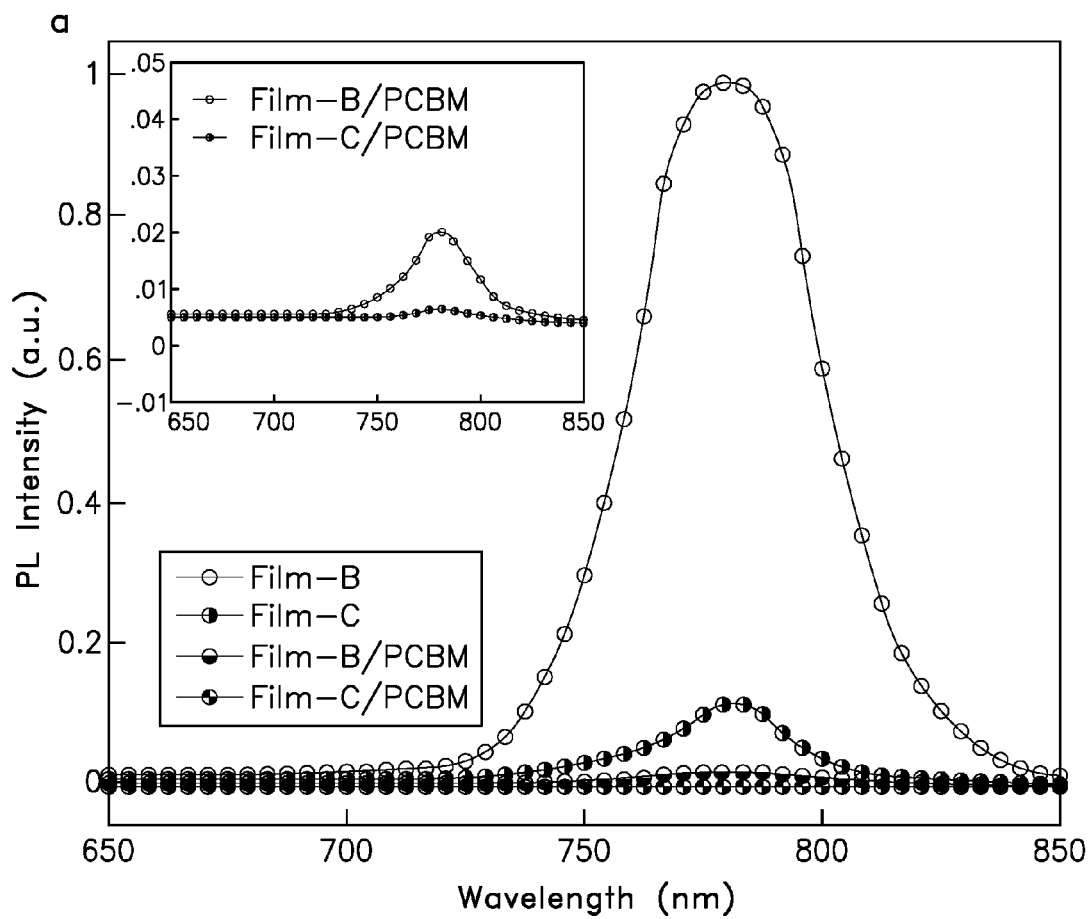
FIG. 6A is a graph showing the photoluminescence (PL) spectra of: quarts/pure-perovskite film (quarts/film/Device-B), quarts/blended-film of perovskite: $A_{10}C_{60}$ (quarts/film/Device-C), quarts/pure-perovskite film/$PC_{61}BM$ (quarts/film/Device-B/$PC_{61}BM$), and quarts/blended-film/$PC_{61}BM$ (quarts/film-C/$PC_{61}BM$) in accordance with the concepts of the various embodiments of the present invention.

Consequently, both the AFM and the SEM images suggest an interpenetrating network of perovskite:ws-fullerene composites in Film-C. To determine whether such BHJ network of Film-C is the sufficient condition of the enhanced electron extraction efficiency, a photoluminescence (PL) measurement for the following films was performed: pure-perovskite film (film-B), perovskite:ws-fullerene blended-film (film-C), bi-layer film of pure-perovskite/$PC_{61}BM$ (film-B/$PC_{61}BM$), and bi-layer film of blended-film/$PC_{61}BM$ (film-C/$PC_{61}BM$), as shown in FIG. 6A. From the PL spectra, it is observed that a more strikingly quenching effect occurs in film-C than in film-B/device 10A. This indicates in that a much more efficient charge separation of the excitons at the interface of perovskite and ws-fullerene occurs in BHJ film-C/device 10. Moreover, the inserted PL spectra also demonstrated a more sufficient electron extraction in film-C/$PC_{61}BM$ interface than that in film-B/$PC_{61}BM$ interface. Therefore, the PL spectra confirmed the contribution of enlarged interface in the BHJ structure to realizing higher electron efficiency.

Figure 6B:
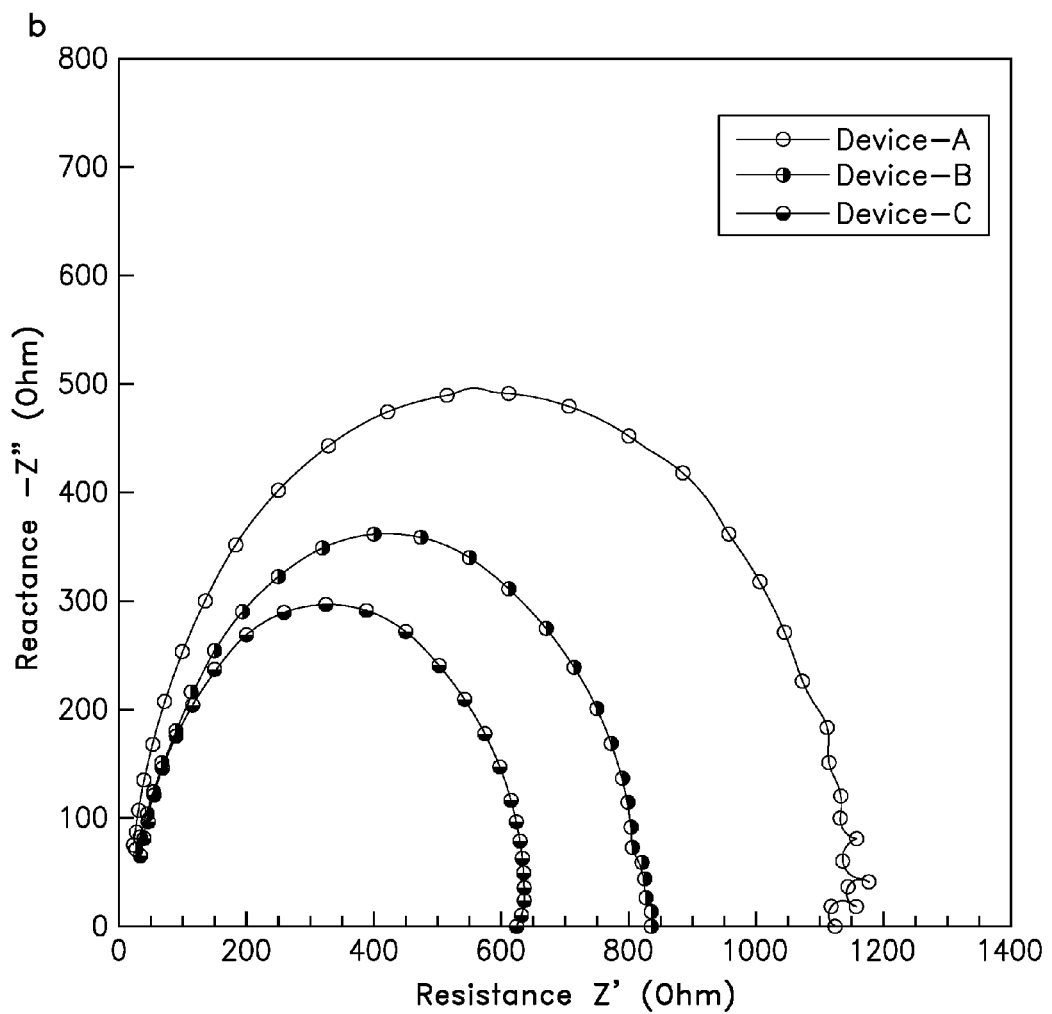
FIG. 6B is a Nyquist plot at $V=V_{OC}$ of perovskite solar cells, whereby Device A has PHJ a structure of: ITO/PEDOT:PSS/$CH_3NH_3PbI_3$ (prepared from isopropanol)/$PC_{61}BM$/Al; Device-B has a PHJ structure of: ITO/PEDOT:PSS/$CH_3NH_3PbI_3$ (prepared from ethanol)/$PC_{61}BM$/Al.

In order to evaluate the electrical properties of the various interfaces, an impedance spectroscopy (IS) was applied to evaluate the internal series resistance (Rs) of these three pero-HSCs, device A, B (device 10A) and C (device 10). The IS analysis allows for the monitoring of detailed electrical properties of the interface that cannot be determined by direct current measurements. The Rs includes the sheet resistance ($R_{SH}$) of the electrodes, the charge-transfer resistance ($R_{CT}$) at the interfaces between the electrode and the carrier selective layer, as well as the carrier selective layer and BHJ active layer, inside of the BHJ active layer. For these three pero-HSCs, devices A, B and C, the only difference is the $R_{CT}$ at the interfaces between the perovskite and fullerene. FIG. 6B shows the Nyquist plots under the light intensity of 100 mW/$cm^2$ of pero-HSCs at the $V_{OC}$ of each device. From the plots, a $R_{CT}$ of 1.17, 0.85, and 0.66 kΩ was obtained for devices A, B and C, respectively. In the PHJ of devices A and B, a lower resistance in device-B/device 10A indicated an improved contact at the interface of the perovskite:fullerene PHJ, thus allowing for better carrier transferring properties. For the BHJ device-C/device 10, in spite of a larger interface area, the decreased charge transfer resistance indicated an excellent interface for electron extraction.

Thus, the embodiments of the present invention, including solar cell devices 10 and 10A utilized ethanol to replace the use isopropanol as a precursor solvent for the MAI. Using two-step processing, the $PbI_2$ precursor was completely or almost completely, converted into $CH_3NH_3PbI_3$ perovskite to achieve a much smoother film. Consequently, the improved contact of the $CH_3NH_3PbI_3$ with the $PB_{61}BM$ and the elimination of the direct contact of the $CH_3NH_3PbI_3$ with the Al provided enhanced performance of 11.45%. In addition, to further improve the electron extraction efficiency to balance with hole extraction efficiency, a BHJ structure of a perovskite:w-s fullerene composite was utilized. Using a mixed precursor solution of water soluble (ws-fullerene) and MAI, a blended interpenetrating network was realized, eventually giving rise to an improved power conversion efficiency of 13.97%. The balanced carrier extraction in the BHJ pero-HSCs leads to an extremely large FF of 81.6%. Thus, the use of a BHJ structure in a pero-HSC offers an efficient way to further increase the operating performance of the solar cells of the various embodiments of the present invention.

As previously discussed, there are generally two structures utilized for perovskite based solar cells: planar heterojunction (PHJ) solar cells, and meso-superstructured solar cells (MSSC) utilizing mesoporous $TiO_2$ and $Al_2O_3$ as an electron transporting layer (ETL) and insulating scaffold, respectively. Power conversion efficiency (PCE) of over 15% has been achieved from solution processed perovskite solar cells employing these two structures. However, limitations exist in both structures, which sacrifice high PCE. For PHJ perovskite solar cells, despite the appealing advantage of a facile or simplistic processing method, insufficient electron transporting layer (ETL)/perovskite layer interfaces give rise to low charge carrier generation efficiency and a high probability of recombination, which limits the enhancement of short-circuit-current density ($J_{SC}$) and fill factor (FF). For MSSC, the mesoporous metal oxides provide abundant interfaces for exciton dissociation, however, the high temperature sintering process of mesoporous metal oxides restricts the commercialization of perovskite MSSC. Therefore, the embodiments of the bulk heterojunction (BHJ) perovskite solar cells of the present invention to be discussed provide performance advantages of both PHJs and MSSCs, including high PCE of about 14.86%, as well as compatibility with low-temperature processing.

Organic-inorganic hybrid perovskite materials have become desirable for use in photodetector devices, such as photovoltaic solar cell devices. One of the most attractive organic-inorganic hybrid perovskite materials is a class of organometal halide perovskite with a structure $MAX_3$ (M=$CH_3NH_3$, A=Pb, x=$Cl^-$, $Br^-$ or $I^-$) structure, which forms the $MX_6$ octahedra where M is located at the center of the octahedral and X lies in the corner around M. The organometal halide perovskite materials are direct bandgap semiconductors, which endow the material with a high absorption extinction coefficient ranging from visible to near infrared region. Moreover, ambipolar transport characteristics of perovskite material enable both holes and electrons to be transported simultaneously in perovskite solar cells. In addition, the long charge carrier diffusion length of perovskite materials (~1 um in $CH_3NH_3PbI_{3-x}Cl_x$ ~100 nm in $CH_3NH_3PbI_3$)[5] encourages the progressive development of perovskite hybrid solar cells (pero-HSCs) based on planar heterojunction (PHJ), which has surpassed the dye-sensitized solar cells (DSSC) in a very short timescale, with PCE ranging from 3% to over 15%. However, due to the shorter diffusion length of electrons as compared to that of holes in $CH_3NH_3PbCl_{3-x}I_x$ perovskite material ($L_{-eff,\ e-}/L_{eff,\ h+}<1$) measured by electron-beam induced current (EBIC) measurement, a mesoporus electron transporting scaffold is indispensable to effectively extract and transport the electrons. Consequently, high PCEs over 15% have been achieved by applying meso-structured $TiO_2$ and $Al_2O_3$ as the electron transport layer (ETL) and insulating scaffold, respectively. Nevertheless, it should be appreciated that the electrical conductivity of $TiO_2$ is too low (~$10^{-11}$ S/m) to allow the effective electron transport from perovskite material to the cathode electrode. In addition, issues have also arisen from the high temperature sintering process needed for forming the mesoporous metal oxides and the homogeneous infiltration of perovskite materials into the mesoporus electron transport material, which are especially adverse for large-scale commercialization of pero-HSCs. As a result, there is a need for improved electron transport between the perovskite material and the ETL in order to increase the efficiency of PHJ pero-HSCs.

As such, the embodiments of the present invention provides a high-performance PHJ pero-HSC employing solution-processed [6,6]-phenyl-C61-butyric acid methyl ester ($PC_{61}BM$) as the ETL. The highest short circuit current density ($J_{SC}$) of 25.2 $mA/cm^2$ reported so far, with a fill factor (FF) of 51% and a corresponding power conversion efficiency (PCE) of 12.21% are observed. This high performance originates as a result of the much higher electrical conductivity of $PC_{61}BM$ (~$10^{-7}$ S/m) than that of $TiO_2$, and the low hole mobility of $PC_{61}BM$, which can prevent holes from being transported to the cathode electrode. Nevertheless, issues induced by the insufficient $PC_{61}BM$/$CH_3NH_3PbI_3$ interfaces, which emerged as the prime detriment for a high FF, hinder further improvement in the efficiency of such devices. In addition, the poor wettability of $PbI_2$ precursor solution on the top of the $PC_{61}BM$ layer causes coverage issues for perovskite formed afterward. Such incomplete coverage inevitably leads to parasitic loss current, and thereby decreases the parallel resistance of the device. To address these problems, a bulk heterojunction (BHJ) pero-HSCs is contemplated by the various embodiments of the present invention that is formed by initially mixing $PC_{61}BM$ with one of the perovskite precursor $PbI_2$, which is then followed by a two-step fabrication process. Contribution from the mixed $PC_{61}BM$ is twofold: first, due to its high electron affinity and a ~0.3 eV energy level offset of the lowest unoccupied molecular orbital (LUMO) between $CH_3NH_3PbI_3$ and $PC_{61}BM$, the blended $PC_{61}BM$ can effectively extract the electrons from the $PC_{61}BM$/$CH_3NH_3PbI_3$ interfaces. In this way, the blended $PC_{61}BM$ acts as the "electron acceptor" similar to that in BHJ polymer solar cells (PSCs). Secondly, the incorporation of $PC_{61}BM$ into the $PbI_2$ solution abundantly improves the wettability of perovskite materials on the top of the $PC_{61}BM$ layer, which is beneficial for the formation of a homogeneous active layer. In addition, since each layer of the BHJ pero-HSCs of the embodiments of the present invention can be low-temperature solution-processed, the architecture of the embodiments of the present invention is compatible with large-scale manufacturing, making it possible for the commercialization of pero-HSCs. Consequently, the BHJ pero-HSCs of the various embodiments of the present invention possess the combined advantages of both PHJ and meso-structured pero-HSCs, and show a high $J_{SC}$ of 27.6 $mA/cm^2$, FF of 57%, $V_{OC}$ of 0.95 V, as well as a correspondingly superior PCE of 14.86%.

Thus, a solar cell in accordance with one or more embodiments of the present invention is generally referred to by numeral 200, as shown in FIG. 9A. The solar cell 200 includes a solution processed perovskite active layer 210, which is formed of an organometal halide perovskite, such as a methylammonium lead halide $CH_3NH_3PbX_3$, where X=Cl, Br or I. For example, in some embodiments the perovskite active layer 210 may be formed of $CH_3NH_3PbI_3$, which may be solution processed from methylammonium iodide (MAI) that is dissolved in ethanol or other solvent, in a manner to be discussed. However, it should be appreciated that any other suitable organometal halide perovskite material may be utilized. It should be appreciated that the perovskite material of the active layer 210 may comprise an n-type perovskite hybrid semiconductor material.

Disposed directly adjacent to one or more surfaces of the active layer 210 is an electron transport layer (ETL) 220. The ETL 220 includes a fullerene layer 230, which may be formed of any suitable fullerene, such as $PC_{61}BM$ or derivatives thereof, which is disposed directly adjacent to the active layer 210. The ETL layer 220 may also include a $TiO_2$ layer 240 disposed adjacent to the fullerene layer 230. In addition, an at least partially light transparent, electrically conductive oxide (TCO) electrode 250 is positioned directly adjacent to the ETL layer 230, and in some embodiments the electrode 250 may be positioned directly adjacent to the TiO$_2$ layer 240. In some embodiments, the TCO layer 250 may be formed of indium-tin-oxide (ITO), as well as any other suitable material.

Also disposed directly adjacent to one or more other surfaces of the active layer 210 is a hole transport layer (HTL) 260. The HTL 260 includes a polymer layer 270, such as a polymerized thiophene, including poly(3-hexylthiophene) (P3HT) for example. The HTL layer 260 may also include a MoO$_3$ layer 280 that is disposed adjacent to the polymer layer 270. In addition, a metal electrode 290 is positioned directly adjacent to the HTL layer 250, which may be formed of aluminum (Al), calcium (Ca) or gold (Au), as well as any other suitable material.

As such, the solar cell 200 is configured so that the active layer 210 is arranged as a planar heterojunction (PHJ) with regard to the ETL layer 220, HTL 250 and electrodes 240 and 280.

In another embodiment of the solar cell 200A, as shown in FIG. 9B, the active layer 210 is replaced with a composite of perovskite material (such as an n-type perovskite hybrid semiconductor material) and a fullerene, referred to as layer 210A. In some embodiments, the fullerene may comprise a non-water soluble fullerene, such as PC$_{61}$BM, or derivatives thereof, as well as any other suitable fullerene. However, in other embodiments, a water soluble-fullerene may be used. In addition, the perovskite material may be formed of an organometal halide perovskite, such as a methylammonium lead halide CH$_3$NH$_3$PbX$_3$, where X=Cl, Br or I, in the manner to be discussed.

2. Experimental Data

Materials:

TiO$_2$ precursor, tetrabutyl titanate (TBT) and PC$_{61}$BM was purchased from Sigma-Aldrich and Nano-C Inc., respectively, and used as received without further purification. Lead iodine (PbI$_2$) was purchased from Alfa Aesar. Methylammonium iodide (CH$_3$NH$_3$I, MAI) was synthesized in the lab using known techniques. For PHJ pero-HSCs fabrication, the perovskite precursor solution was prepared as follows: PbI$_2$ and CH$_3$NH$_3$I were dissolved in dimethylformamide (DMF) and ethanol with a concentration of about 400 mg/mL for PbI$_2$, and 35 mg/mL for CH$_3$NH$_3$I, respectively. For BHJ pero-HSCs fabrication, different weight ratios of PC$_{61}$BM were added into the 400 mg/ml PbI$_2$ precursor solution, with a small amount of dichlorobenzene (o-DCB). All the solutions were heated to about 100° C. for about 10 minutes to ensure both the MAI and PBI$_2$ were fully dissolved.

Pero-HSCs Fabrication and Characterization:

A compact TiO$_2$ layer was deposited on pre-cleaned ITO substrates from tetrabutyl titanate (TBT) isopropanol solution (concentration 3 vol %), with thickness of ~60 nm, followed by thermal annealing at 90° C. for about 60 minutes in ambient atmosphere. Next, a PC$_{61}$BM layer with thickness of ~50 nm was casted on the top of compact TiO$_2$ layer from o-DCB solution. For the PHJ composites fabrication (device 200), PbI$_2$ (dissolved in DMF) and MAI (dissolved in ethanol) with concentration of about 400 mg/mL and 35 mg/mL, respectively, were spun on the top of PC$_{61}$BM layer subsequently, followed with thermal annealing at 100° C. for about 2 hours. For BHJ composites fabrication (device 200A, the PC$_{61}$BM:PbI$_2$ solution (dissolved in DMF with small amount of o-DCB) and the MAI (dissolved in ethanol) with concentration of 400 mg/mL and 35 mg/mL, respectively, were spun on the top of PC$_{61}$BM layer subsequently, followed with thermal annealing at 100° C. for about 2 hours. Afterward, poly(3-hexylthiophene-2, 5-diyl) (P3HT) was spin coated on the top of the perovskite layer from the o-DCB (2% wt) solution. The pero-HSCs were finished by thermal evaporating MoO$_3$ (8 nm) and aluminum (Al) (100 nm). The device area is defined to be 0.045 cm$^2$.

Pero-HSCs were characterized under an AM 1.5 G calibrated solar simulator (Newport model 91160-1000) with the light intensity of about 100 mW/cm$^2$, which was calibrated by utilizing a mono-silicon detector (with KG-5 visible color filter) from National Renewable Energy Laboratory (NREL) to reduce spectral mismatch. The J-V characteristics of pero-HSCs were recorded using a Keithley 2400 source meter. The incident photon to current efficiency (IPCE) was measured through the IPCE measurement setup in use at ESTI for cells and mini-modules. A 300 W steady-state xenon lamp provides the source light. Up to 64 filters (8 to 20 nm width, range from 300 to 1200 nm) are available on four filter-wheels to produce the monochromatic input, which is chopped at 75 Hz, superimposed on the bias light and measured via the usual lock-in technique. After collection the ICPE data, the software also integrated the data with the AM1.5G spectrum to calculate the J$_{SC}$ value, to ensure the accuracy of the measurement.

Impedance spectroscopy (IS) was obtained using a HP 4194A impedance/gain-phase analyzer, under the illumination of white light with a light intensity of 100 mW/cm$^2$, with an oscillating voltage of 50 mV and frequency of 5 Hz to 13 MHz.

Thin Film Characterizations:

The thickness of the TiO$_2$, the PC$_{61}$BM and the perovskite film were measured using tapping-mode atomic force microscopy (AFM) images captured by a NanoScope NS3A system (Digital Instrument). Contact angles of the PBI$_2$ solution and PbI$_2$:PC$_{61}$BM solution on the top of PC$_{61}$BM layer were measured by KRUSS DSA 100. In addition, photoluminescence (PL) spectra were obtained with a 532 nm pulsed laser as excitation source at a frequency of about 9.743 MHz.

Results and Discussion

First, the influence of different weight ratios of PC$_{61}$BM in the PbI$_2$ solution on the performance of the pero-HSCs was investigated, as shown in FIG. 7. Thus, it is shown that both the short-circuit current density (J$_{sc}$) and the fill factor (FF), and consequently the power conversion efficiency (PCE), was increased by increasing the weight ratio of PC$_{61}$BM:PbI$_2$ from 0 to 10:400, then dropped with further enhancement of the PC$_{61}$BM percentage, and finally remains at a certain value. The open-circuit voltage (V$_{oc}$) stays invariant (0.95V) for all different weight ratios of PC$_{61}$BM:PbI$_2$. The first rising stage is primarily attributed to the increased "donor/acceptor" interfaces for the efficient charge carrier extraction and transportation, which are reflected in the agreement of both J$_{SC}$ and FF. However, when the PC$_{61}$BM percentage was further increased, the inferior electrical conductivity of PC$_{61}$BM, as compared to that of the perovskite material, brings about the descending stage, which has a negative influence on charge transport efficiency, and as a result leads to a dramatically reduced J$_{SC}$. Lastly, the almost invariant power conversion efficiency (PCE) indicates the saturation of PC$_{61}$BM in the DMF (with small amount of o-DCB solvent). Thus, balancing the amount of "donor/acceptor" interfaces and the electrical conductivity of the active layer is critical for obtaining high performance BHJ pero-HSCs. Also, as it is evidenced from the contact angle measurement, the $PC_{61}BM:CH_3NH_3PbI_3$ solution showed a drastically reduced contact angle of 14.1° (FIG. 8B), as compared to the angle of 42.7° of pure $PbI_2$ disposed on the top of $PC_{61}BM$ layer (FIG. 8A), suggesting a more homogeneous perovskite active layer.

J-V characteristics were carried out to evaluate the role of $PC_{61}BM$ as electron transport layer (ETL) in planar heterojunction (PHJ) (device 200) pero-HSCs and electron acceptor in BHJ pero-HSCs (device 200A), respectively. FIG. 9C shows J-V curves for the following devices, which include: pristine pero-HSCs having a structure of: $ITO/TIO_2/CH_3NH_3PBI_3/P3HT/MoO_3/Al$; $PC_{61}BM$ PHJ pero-HSCs (device 200 as shown in FIG. 9A) having a structure of: $ITO/TIO_2/PC_{61}BM/CH_3NH_3PbI_3/P3HT/MoO_3/Al$; and $PC_{61}BM:CH_3NH_3PbI_3$ BHJ pero-HSCs (device 200A as shown in FIG. 9B): $ITO/TiO_2/PC_{61}BM/PC_{61}BM:CH_3NH_3PbI_3/P3HT/MoO_3/Al$. The pristine pero-HSCs show a $V_{OC}$ of 0.90V, a $J_{SC}$ of 20.0 mA/cm², a FF of 37% and a PCE of 6.90%. $PC_{61}BM$ PHJ pero-HSCs exhibited a $V_{OC}$ of 0.95V, a $J_{SC}$ of 25.2 mA/cm², a FF of 51% and a PCE of 12.21%. The significantly enhanced $J_{SC}$ and FF are the result of the much larger electrical conductivity of $PC_{61}BM$, which can realize the effective extraction and transportation of electrons from perovskite material to the cathode electrode. Moreover, due to the hole blocking property of $PC_{61}BM$, holes back transfer and charge carrier recombination at the $TiO_2/CH_3NH_3PbI_3$ interfaces can also be suppressed, contributing to both enhanced FF and $J_{SC}$. With the addition of $PC_{61}BM$ into the perovskite system, $PC_{61}BM:CH_3NH_3PbI_3$ pero-HSCs achieve a $V_{OC}$ of 0.95V, a $J_{SC}$ of 27.6 mA/cm², a FF of 57% and a PCE of 14.86%. The most remarkable argument is embodied by FF, which is the result of synaptic actions from both increased $PC_{61}BM/CH_3NH_3PbI_3$ interfaces and improved wettability of the $PbI_2$ on $PC_{61}BM$ layer. The incident photon to current efficiency (IPCE) spectra of the three devices was demonstrated in FIG. 9D, which specifies the ratio of extracted electrons to incident photons at a given wavelength. The pristine pero-HSCs showed a wide response in the visible to the near-infrared region, achieving ~60% in the 400-600 nm range. With the incorporation of $PC_{61}BM$ as the ETL, $PC_{61}BM$ PHJ HSCs showed much higher response reaching ~80% in the visible region. In $PC_{61}BM:CH_3NH_3PbI_3$ BHJ pero-HSCs over 90% IPCE response was obtained. Enhancement of the response was manifested in the region from 350-450 nm (reaching ~85%), which was from the contribution of $PC_{61}BM$ in the BHJ active layer. Integration of the IPCE spectra resulted in 18.3 mA/cm², 24.0 mA/cm² and 26.4 mA/cm² for pristine pero-HSCs, $PC_{61}BM$ PHJ HSCs and $PC_{61}BM:CH_3NH_3PBI_3$ BHJ pero-HSCs, respectively, in good agreement with $J_{SC}$ calculated from J-V characteristics.

In order to further study the function of $PC_{61}BM$ as a more effective ETL, two contacts at the cathode electrode were evaluated: $TiO_2/CH_3NH_3PbI_3$ (from pristine pero-HSCs) and $PC_{61}BM/Ch_3NH_3PbI_3$ (from PC61BM PHJ pero-HSCs) using capacitance-voltage (C-V) measurements. It is noteworthy that the capacitances arise from the depletion regions at the $TiO_2:CH_3NH_3PbI_3$ interfaces, respectively. Through Mott-Schottcky analysis, depletion regions and doping density were estimated. For the measurement, gold (Au) electrodes were used as both the hole-extraction layer and the anode electrode to replace $P3HT/MoO_3/Al$ in the original device. Because gold has the same work function (5.4 eV) as the highest occupied molecular orbital (HOMO) of $CH_3NH_3PbI_3$, it can form barrier-less contact at the anode side. Consequently, the only depletion region is at the $TiO_2/CH_3NH_3PbI_3$ interface in the pristine-HSCs ($ITO/TiO_2/CH_3NH_3PbI_3/Au$), and at the $PC_{61}BM/CH_3NH_3PbI_3$ interface in the $PC_{61}BM$ pero-HSCs ($ITO/TiO_2/PC_{61}BM/CH_3NH_3PbI_3/Au$), which are demonstrated in the energy level alignments in FIGS. 10A and 10B, respectively.

C-V results are presented in FIGS. 10C and 10D. The depletion region capacitance is given by equation (1):

$$\frac{1}{C_D^2} = \frac{2}{q\varepsilon_o\varepsilon N}(V_{bi} - V),$$

where $C_D$ is the depletion-layer capacitance per unit area, $\varepsilon_0$ is the permittivity of the free space, $\varepsilon$ is the static permittivity, N is the doping density of the donor, and V is the applied voltage. The static permittivity of $CH_3NH_3PbI_3$ and $PC_{61}BM$ were applied as 30 and 5, respectively. Slopes of the linear regions extracted from FIGS. 9C and 9D were $3.2\times10^{16}F^{-2}V^{-1}$ and $3.4\times10^{16}F^{-2}V^{-1}$, respectively, for the pristine pero-HSCs and $PC_{61}BM$ pero-HSCs. Substituting in equation (1), doping density of $CH_3NH_3PbI_3$ film is calculated to be $7.3\times10^{16}$ cm$^{-3}$ and $6.8\times10^{16}$, in the pristine pero-HSCs and the PC61BM pero-HSCs, respectively, which are in good agreement with each other. In addition, the built-in potential of the two devices is extracted from the intercept of the linear regime with the X-axis, which are shown to be 0.76V and 0.82V for the pristine pero-HSCs and the $PC_{61}BM$ pero-HSCs, respectively, is consistent with the $V_{OC}$ of the devices. Then, the depletion region was expressed by equations (2a) and (2b), respectively, as follows:

$$W_{Dp} = \sqrt{2\varepsilon V_{bi} \frac{N_D}{N_A(N_A+N_D)}}; \quad W_{Dn} = \sqrt{2\varepsilon V_{bi} \frac{N_A}{N_D(N_A+N_D)}},$$

where $N_A$ and $N_D$ are the doping densities of the acceptor and donor, respectively. For the pristine pero-HSCs, the depletion width on the n-side ($TiO_2$) was calculated to be about 16 nm, and 38 nm on the p-side ($CH_3NH_3PbI_3$). Since the thickness of the $CH_3NH_3PbI_3$ layer is ~280 nm, only a seventh of the active layer is depleted, which means electrons in the active layer need to travel a long distance to reach the depletion region, generating a high probability of recombination. In comparison, the depletion was calculated to be about 35 nm in width on the n-side ($PC_{61}BM$), and about 52 nm on the p-side ($CH_3NH_3PbI_3$) in the PC61BM pero-HSCs. This indicates that the charge carriers recombination will be largely decreased due to the greatly increased depletion region in the perovskite film. Such results profoundly explain the dramatically enhanced $J_{SC}$ and FF in pero-HSCs incorporating $PC_{61}BM$ as an electron transport layer (ETL), as in the embodiments of the present invention, as compared to pristine pero-HSCs.

Subsequently, to have a better understanding of the increased $J_{SC}$ in $PC_{61}BM$ that is incorporated in the pero-HSCs, photoluminescence (PL) properties of the three thin films, including: $TiO_2/CH_3NH_3PbI_3$, $TiO_2/PC_{61}BM/CH_3NH_3PbI_3$ (device 200) and $TiO_2/PC_{61}BM/PC_{61}MB:CH_3NH_3PbI_3$ (device 200A) were evaluated, as shown in FIG. 11. It was found that a more strikingly quenching effect was achieved in $TiO_2/PC_{61}BM/CH_3NH_3PbI_3$ than in that of $Tio_2/CH_3NH_3PbI_3$. This indicates that a much more efficient electron transport was achieved at the PC$_{61}$BM/ CH$_3$NH$_3$PbI$_3$ interface (device 200) as compared to that at the TiO$_2$/CH$_3$NH$_3$PbI$_3$ interface. This confirms the role of higher electrical conductivity of PC$_{61}$BM in favoring the electron extraction at the ETL/perovskite material interface, as in the embodiments of the present invention. Remarkably, an even greater quenching effect is observed in the TiO$_2$/ PC$_{61}$BM/PC$_{61}$BM:CH$_3$NH$_3$PbI$_3$ film of the embodiments of the present invention, which confirms the role of PC$_{61}$BM as an electron acceptor in the PC$_{61}$BM:CH$_3$NH$_3$PbI$_3$ BHJ composite of device 200A.

Next, the thin film morphology of the PC$_{61}$BM: CH$_3$NH$_3$PbI$_3$ BHJ composites (device 200A) was investigated, in comparison with the pure CH$_3$NH$_3$PbI$_3$ film. Firstly, absorption spectra of the pure CH$_3$NH$_3$PbI$_3$ film, PC$_{61}$BM:CH$_3$NH$_3$PBI$_3$ BHJ film and PC$_{61}$BM film were measured to evaluate the crystallization of the perovskite films with and without PC$_{61}$BM. As shown in FIG. 12, a more compact crystal ordering of the perovskite material upon the introduction of the PC$_{61}$BM can be deduced, owing to the red-shifted absorption spectra of the PC$_{61}$BM: CH$_3$NH$_3$PbI$_3$ BHJ film. In addition, the PC$_{61}$BM contributes to the absorption in the region from 350-450 nm, which is also one of the origins for the enhanced J$_{SC}$ in PC$_{61}$BM: CH$_3$NH$_3$PbI$_3$ BHJ pero-HSCs.

X-ray diffraction (XRD) was performed to evaluate how crystallization changed with the introduction of PC$_{61}$BM in the perovskite material. FIGS. 13A and 13B present the XRD spectra of pure CH$_3$NH$_3$PbI$_3$ perovskite thin film and the PC$_{61}$BM:CH$_3$NH$_3$PbI$_3$ BHJ thin film (device 200A) under different annealing periods, from 0 minutes to 120 minutes. From the first annealing stage (0 minutes), shown in FIG. 13A, a prompt reaction of PbI$_2$ and CH$_3$NH$_3$I can be observed from the diffraction peaks at 14.1° and 40.6°, which are assigned to the (110) and (224) planes in the perovskite orthorhombic crystal structure. After thermal annealing for about 60 minutes, the formation of the orthorhombic crystal structure was almost completed. In clear contrast, FIG. 13B reveals a retarded or incomplete reaction between the PbI$_2$ and the CH$_3$NH$_3$I upon the addition of PC$_{61}$BM, presenting barely a minor diffraction peak at 14.1° that belongs to the perovskite orthorhombic crystal structure. Even after an annealing period of about 60 minutes, sharp peaks at 12.3°, 25.3°, 38.5° belonging to the PbI$_2$, and 19.8° belonging to the CH$_3$NH$_3$I show the incomplete reaction between the PbI$_2$ and the CH$_3$NH$_3$I. The retarded or incomplete reaction may be attributed to the formation of PC$_{61}$BM-CH$_3$NH$_3$I intermediate phase, which is due to the interactions between the ester groups in the PC$_{61}$BM with the CH$_3$NH$_3$I. This incomplete reaction facilitated the development of a more uniform and dense perovskite layer, which yielded a greatly improved FF in the PC$_{61}$BM:CH$_3$NH$_3$PbI$_3$ BHJ pero-HSCs.

Consequently, top view scanning electron microscopy (SEM) images were conducted to inspect whether the thin film morphology improved with the introduction of PC$_{61}$BM. As shown in FIGS. 14A-B, the larger perovskite grains in PC$_{61}$BM:CH$_3$NH$_3$PbI$_3$ film of device 200A are easily identified, further confirming the pervious results. In addition, given that the grain boundaries are generally the recombination sites, the larger grains with less grain boundaries are favorable for charge transportation, which consequently inhibit the recombination with the BHJ composite active layer.

Lastly, AC (alternating current) impedance spectroscopy (IS) was conducted to evaluate the electrical conductivities, which is able to provide detailed electrical properties of the perovskite solar cells that cannot be determined using direct current measurements. FIG. 15 presents the IS spectra of pristine pero-HSCs, PC$_{61}$BM PHJ pero-HSCs (device 200) and PC$_{61}$BM:CH$_3$NH$_3$PbI$_3$ BHJ pero-HSCs (device 200A). The internal series resistance (R$_s$) is composed of the sheet resistance (R$_{SH}$) of the electrodes, the charge-transfer resistance (R$_{CT}$) inside the perovskite thin film and at the perovskite material/ETL (HTL) interfaces. Since all pero-HSCs possess the same device structure, the R$_{SH}$ was assumed to be the same. The only difference is the R$_{CT}$ that arises from the different electron transport at the ETL/ perovskite interface. R$_s$ of pristine pero-HSCs is 980Ω, which is lowered to 610Ω from the PC$_{61}$BM PHJ pero-HSCs (device 200), and further reduced to 485Ω from the PC$_{61}$BM:CH$_3$NH$_3$PbI$_3$ HBJ pero-HSCs (device 200A). These results confirm the role of PC$_{61}$BM as being a more efficient ETL than that of TiO$_2$. Thus, the efficient ETL benefits the electron extraction and transport from perovskite materials to the cathode electrode, as in the various embodiments of the present invention. The reduced R$_s$ from the PC$_{61}$BM:CH$_3$NH$_3$PbI$_3$ BHJ pero-HSCs (device 200A) is attributed to both increased PC$_{61}$BM/CH$_3$NH$_3$PbI$_3$ interfaces and the enhanced domain size of the perovskite crystals, which exert combined action to expedite charge carrier transport within the BHJ active layer.

Thus, PC$_{61}$BM was first utilized as the ETL of the embodiments of the present invention, and was observed to have a dramatically enhanced PCE of 6.9% to 12.21%, with an ultra-high J$_{SC}$ of 25.2% mA/cm$^2$, which is owed to the much larger electron conductivity and improved hole-blocking properties of PC$_{61}$BM than that of TiO$_2$. However, inferior FFs arising from the insufficient ETL/CH$_3$NH$_3$PbI$_3$ interfaces inhibited further improvement of the PCE. Then, by introducing PC$_{61}$BM into the perovskite active layer, the embodiments of the present invention utilized a BHJ perovskite active layer, where CH$_3$NH$_3$PbI$_3$ acts as a donor and PC$_{61}$BM as an electron acceptor. Compared with the PHJ structure (PCE=12.21%), BHJ perovskite solar cells exhibited ~20% enhancement in PCE, reaching a high PCE of 14.86%. Another advantage of the BHJ structured perovskite solar cells of the embodiments of the present invention is the low-temperature processing, which is desirable in large-area manufacturing.

Thus, in the various embodiments of the solar cell devices of the present invention, including devices 200 and 200A, the planar heterojunction (PHJ) organometal halide perovskite solar cell may employ [6,6]-phenyl-C61-butyric acid methyl ester (PC$_{61}$BM) as an electron transport layer. Thus, because of the much higher electrical conductivity of PC$_{61}$BM over that of TiO$_2$, together with the extremely lower hole mobility, which allows the PC$_{61}$BM to block holes at the cathode electrode of such device, a greatly enhanced J$_{SC}$ of 25.2 mA/cm$^2$ is able to be achieved, leading to a high power conversion efficiency (PCE) of about 12.44%. To further improve the performance, the solar cells of the various embodiments of the present invention may also use a bulk heterojunction (BHJ) perovskite structure, which are prepared by combining PC$_{61}$BM, such as by mixing, into a PbI$_2$ precursor, which is then followed by a two-step processing method, thereby forming a BHJ composite, which allows an improved FF with a high PCE of 14.86% to be achieved. In addition, the various embodiments of the perovskite solar cell of the present invention are able to be fabricated at low-temperature, which is desirable for utilization in commercialized large-area manufacturing.

Therefore, it can be seen that the objects of the present invention have been satisfied by the structure and its method for use presented above. While in accordance with the Patent Statutes, only the best mode and preferred embodiments have been presented and described in detail, with it being understood that the present invention is not limited thereto or thereby. Accordingly, for an appreciation of the true scope and breadth of the invention, reference should be made to the following claims.

What is claimed is:

1. A method of forming a bulk heterojunction active layer of a solar cell comprising:
providing an n-type perovskite hybrid semiconductor material;
combining said perovskite hybrid semiconductor material with a water-soluble or a non-water-soluble fullerene to form a composite material, wherein said composite material is formed by the method of:
combining a methyl ammonium iodide (MAI) material and said water-soluble fullerene or said non-water-soluble fullerene with ethanol to form a precursor material;
providing a lead iodide material; and
applying said precursor material to said lead iodide material to form said composite material of methyl-ammonium lead iodide perovskite and water-soluble fullerene; and
applying said composite material in the solar cell as the bulk heterojunction active layer.

2. The method of claim 1, further comprising:
placing an electron transport layer adjacent to at least one surface of said bulk heterojunction active layer; and
placing a hole transport layer adjacent to at least one other surface of said active layer.

3. The method of claim 2, wherein said electron transport layer comprises a layer of fullerene positioned directly adjacent to the bulk heterojunction active layer.

4. The method of claim 3, wherein said layer of fullerene of said electron transport layer comprises $PC_{61}BM$ or derivatives thereof.

5. The method of claim 1, wherein said applying step is performed by spin casting.

6. The method of claim 5, further comprising thermally annealing the bulk heterojunction active layer.

7. The method of claim 2, further comprising:
placing an electrode adjacent to said electron transport layer; and
placing a second electrode adjacent to said hole transport layer, wherein at least one of said first or second electrodes is an at least partially light transparent electrode.

8. The method of claim 1, wherein said water-soluble fullerene comprises $A_{10}C_{60}$ or derivatives thereof, and said non-water-soluble fullerene comprises $PC_{61}BM$ or derivatives thereof.

9. The method of claim 1, wherein a concentration of said water-soluble fullerene comprising $A_{10}C_{60}$ is between 2.5 mg/ml to 20 mg/ml, and a concentration of said MAI is 35 mg/ml in said precursor material.

10. A method of forming a planar heterojunction active layer of a solar cell comprising:
solution processing a perovskite hybrid semiconductor precursor material comprising ethanol, methyl ammonium iodide (MAI), and fullerene to form a perovskite hybrid semiconductor material; and
providing a layer of said perovskite hybrid semiconductor material in the solar cell as the planar heterojunction active layer.

11. The method of claim 10, wherein said step of solution processing comprises:
providing a lead iodide material; and
applying said precursor material to said lead iodide material to form said perovskite material.

12. The method of claim 11, further comprising:
placing an electron transport layer adjacent to at least one surface of said active layer;
placing a hole transport layer adjacent to at least one other surface of said active layer.

13. The method of claim 12, wherein said electron transport layer comprises a layer of fullerene or derivative thereof positioned directly adjacent to said active layer.

14. The method of claim 13, wherein said layer of fullerene comprises $PC_{61}BM$ or derivatives thereof.

15. The method of claim 12, further comprising:
placing a first electrode adjacent to said hole transport layer; and
placing a second electrode adjacent to said electron transport layer, wherein at least one of said first or second electrodes is an at least partially light transparent electrode.

16. The method of claim 11, wherein said applying step is performed by spin casting.

17. The method of claim 16, further comprising thermally annealing said planar heterojunction active layer.

* * * * *